US011600807B2

(12) United States Patent
Son et al.

(10) Patent No.: US 11,600,807 B2
(45) Date of Patent: Mar. 7, 2023

(54) METHOD OF MANUFACTURING A DISPLAY APPARATUS

(71) Applicant: Samsung Display Co., Ltd., Yongin-si (KR)

(72) Inventors: Ji-Hee Son, Hwaseong-si (KR); Sungchul Kim, Seongnam-si (KR); Jiyoung Choung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 60 days.

(21) Appl. No.: 17/250,662

(22) PCT Filed: Jan. 25, 2019

(86) PCT No.: PCT/KR2019/001056
§ 371 (c)(1),
(2) Date: Feb. 17, 2021

(87) PCT Pub. No.: WO2020/040378
PCT Pub. Date: Feb. 27, 2020

(65) Prior Publication Data
US 2021/0217998 A1 Jul. 15, 2021

(30) Foreign Application Priority Data
Aug. 20, 2018 (KR) .................. 10-2018-0096866

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3246* (2013.01); *H01L 51/0016* (2013.01); *H01L 51/0018* (2013.01)

(58) Field of Classification Search
None
See application file for complete search history.

(56) References Cited

U.S. PATENT DOCUMENTS 4,886,573 A 12/1989 Watanabe et al.
8,846,301 B2 9/2014 Ober et al.
(Continued)

FOREIGN PATENT DOCUMENTS

KR 10-1994-0009174 B1 10/1994
KR 10-2007-0002388 A 1/2007
(Continued)

*Primary Examiner* — Michelle Mandala
(74) *Attorney, Agent, or Firm* — Lewis Roca Rothgerber Christie LLP

(57) ABSTRACT

A method of manufacturing a display apparatus includes: forming a first lower lift-off layer, a first upper lift-off layer, and a first photoresist layer on a substrate on which a first pixel electrode is formed; forming a first masking layer including a first photoresist pattern, a first upper lift-off pattern, and a first lower lift-off pattern, which expose the first pixel electrode, by partially removing the first photoresist layer, the first upper lift-off layer, and the first lower lift-off layer; forming a first light emitting layer and a first counter electrode on the first pixel electrode by using the first masking layer; forming a first passivation layer on the first counter electrode; and removing the first masking layer.

20 Claims, 21 Drawing Sheets

(56) References Cited

U.S. PATENT DOCUMENTS

| | | |
|---|---|---|
| 8,871,545 B2 | 10/2014 | Lee et al. |
| 9,091,913 B2 | 7/2015 | Katz et al. |
| 2017/0256754 A1 | 9/2017 | Defranco et al. |
| 2017/0358633 A1 | 12/2017 | Park et al. |
| 2018/0033968 A1 | 2/2018 | Lee et al. |
| 2018/0190907 A1 | 7/2018 | Kim et al. |
| 2018/0261656 A1* | 9/2018 | Kim .................. H01L 51/0023 |
| 2018/0261769 A1* | 9/2018 | Kwon ................ H01L 51/5228 |
| 2018/0261792 A1* | 9/2018 | Kwon ................ H01L 51/0016 |

FOREIGN PATENT DOCUMENTS

| | | |
|---|---|---|
| KR | 10-2014-0019341 A | 2/2014 |
| KR | 10-2017-0048360 A | 5/2017 |
| KR | 10-2017-0051430 A | 5/2017 |
| KR | 10-2017-0102145 A | 9/2017 |
| KR | 10-2017-0140486 A | 12/2017 |
| KR | 10-2018-0014895 A | 2/2018 |
| KR | 10-2018-0080416 A | 7/2018 |

\* cited by examiner

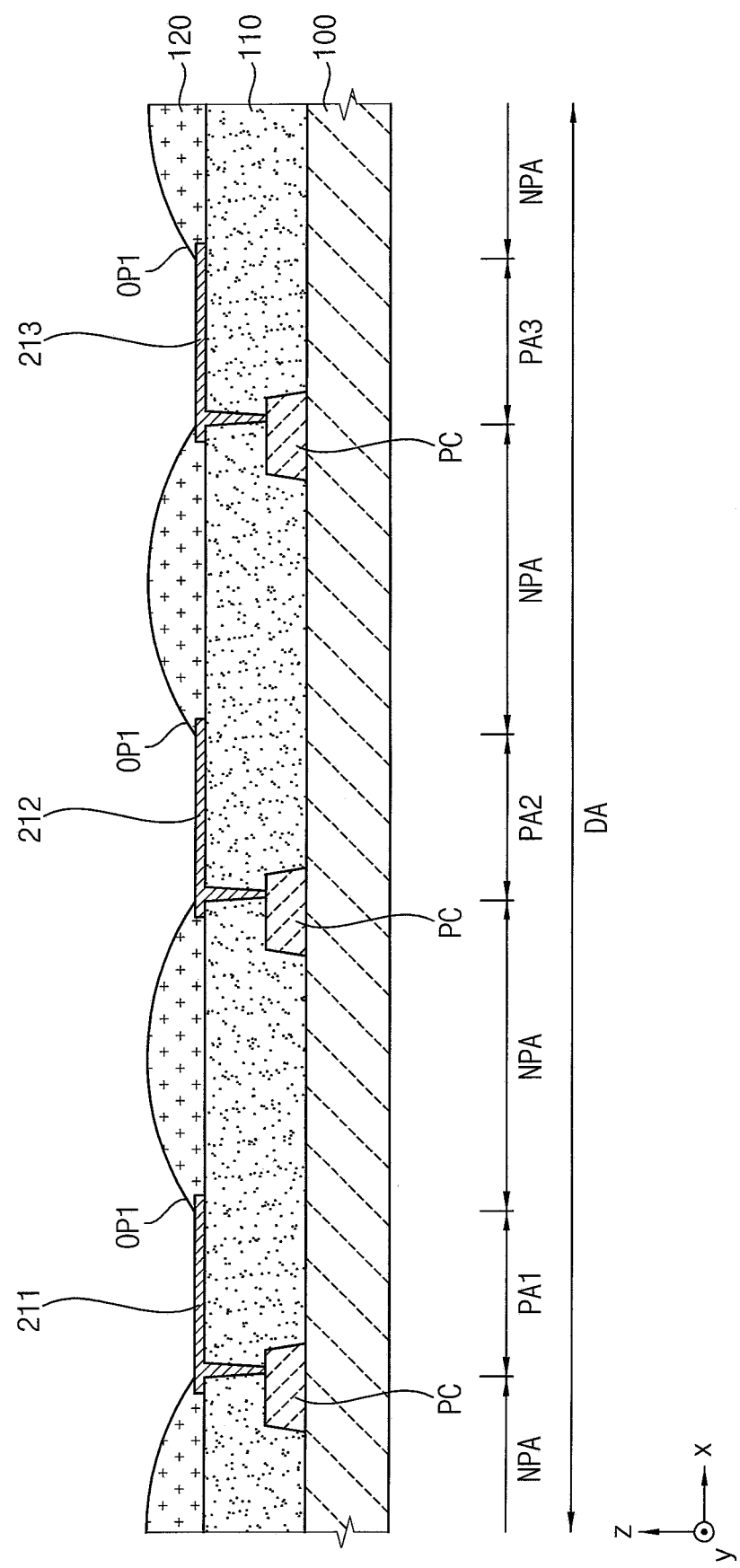

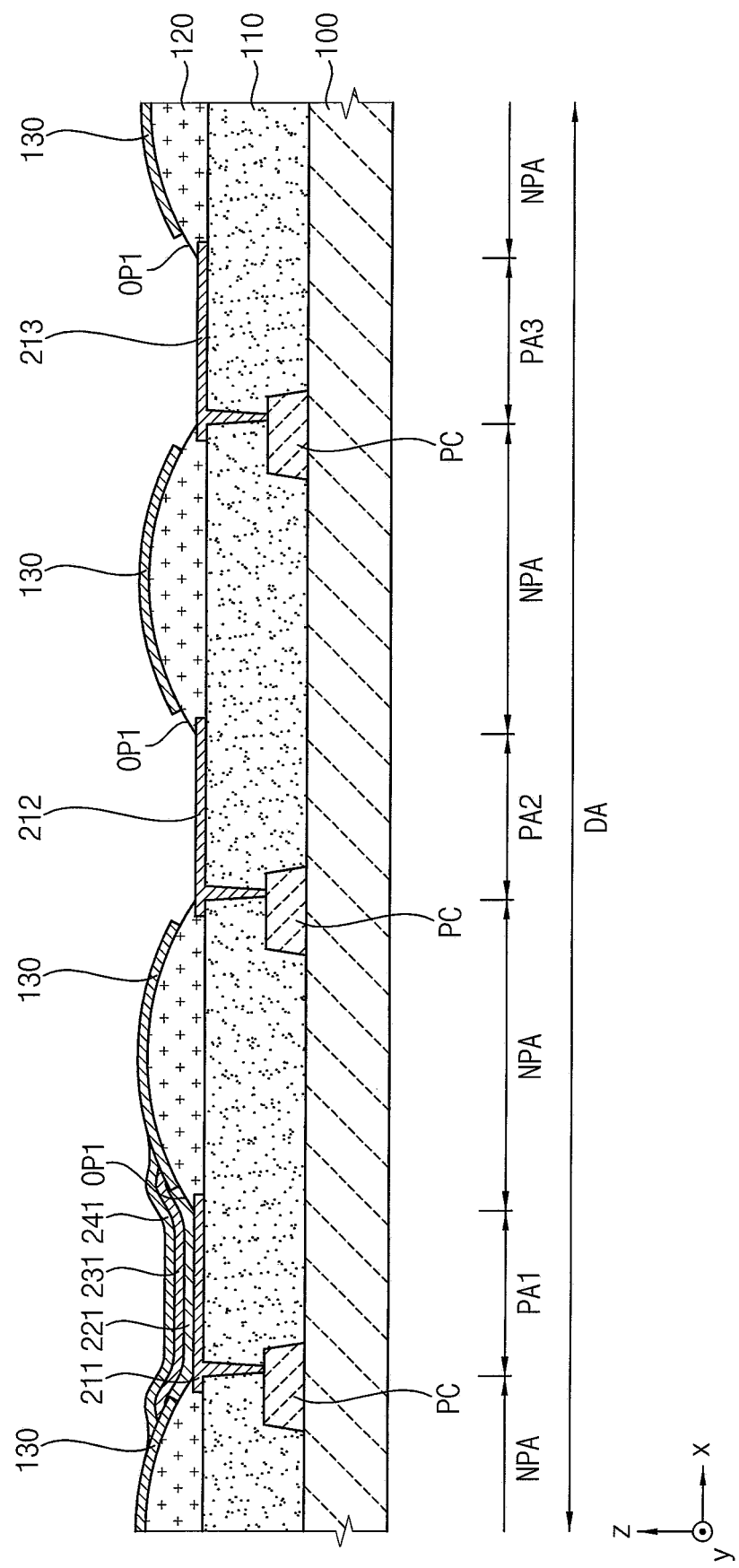

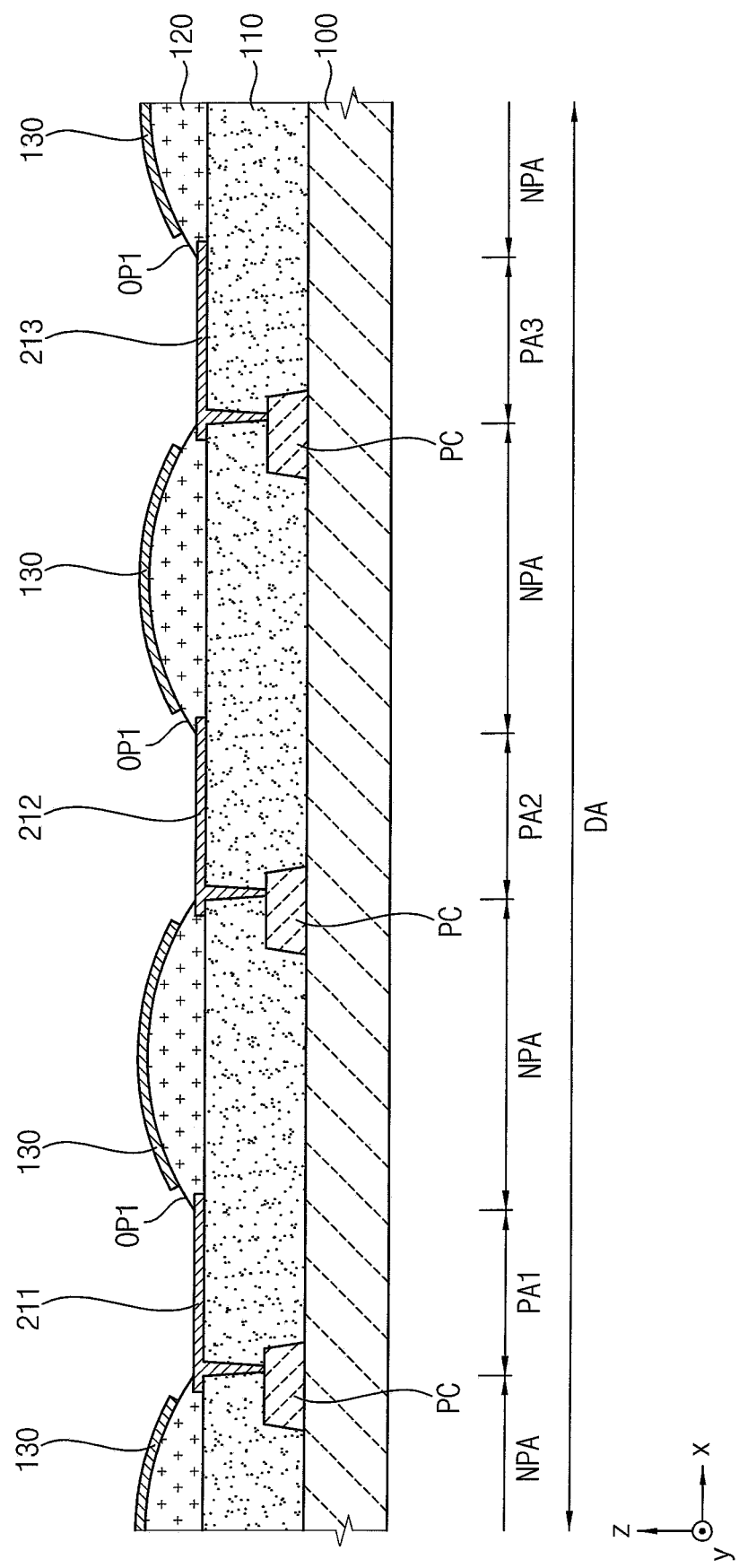

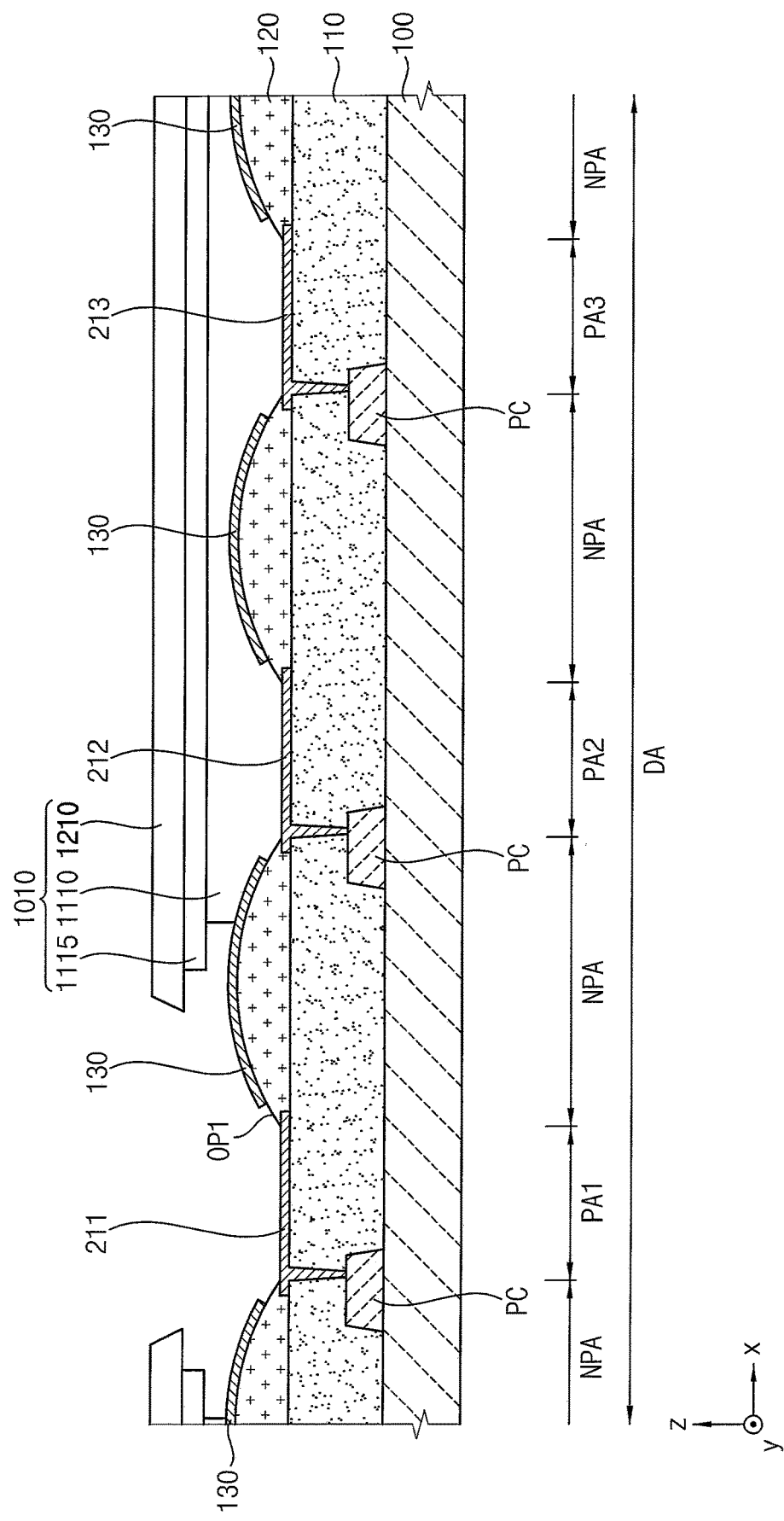

METHOD OF MANUFACTURING A DISPLAY APPARATUS

CROSS-REFERENCE TO RELATED APPLICATIONS

This application is a National Phase Patent Application and claims priority to and the benefit of International Application Number PCT/KR2019/001056, filed on Jan. 25, 2019, which claims priority to Korean Patent Application Number 10-2018-0096866, filed on Aug. 20, 2018, the entire contents of each of which are incorporated herein by reference.

TECHNICAL FIELD

Aspects of example embodiments relate to a method of manufacturing a display apparatus. More particularly, aspects of example embodiments of the present disclosure relate to a method of manufacturing an organic light emitting diode display apparatus.

BACKGROUND

Recently, as technology improves, display products having smaller sizes, lighter weights, and superior performance have been produced. Conventional cathode ray tube (CRT) televisions have been widely used for display apparatuses with many advantages in terms of performance and price. Recently, however, a display apparatus, for example, such as a plasma display apparatus, a liquid crystal display apparatus, and an organic light emitting diode display apparatus, that overcomes disadvantages of the CRT in terms of miniaturization or portability, and has various advantages, for example, such as miniaturization, light weight, and low power consumption, has been spotlighted.

The organic light emitting diode display apparatus is a display apparatus in which each pixels thereof includes an organic light emitting diode. The organic light emitting diode includes a pixel electrode, a counter electrode opposite to the pixel electrode, and a light emitting layer interposed between the pixel electrode and the counter electrode.

In a case of an organic light emitting diode display apparatus that implements full color, such that pixel areas thereof emit mutually different colored lights, a light emitting layer of each pixel and a counter electrode that is integrally formed over a plurality of pixels may be formed by using a deposition mask. As a resolution of the organic light emitting diode display apparatus is increased, a width of an open slit of a mask used in a deposition process is narrowed, and distribution of a plurality of open silts may be reduced.

Problem to be Solved

Embodiments are directed to a method of manufacturing a display apparatus that is capable of displaying a high-resolution image by using a masking layer that facilitates a lift-off process.

Means for Solving the Problem

According to one or more embodiments, a method of manufacturing a display apparatus includes: forming a first lower lift-off layer, a first upper lift-off layer, and a first photoresist layer on a substrate on which a first pixel electrode is formed; forming a first masking layer including a first photoresist pattern, a first upper lift-off pattern, and a first lower lift-off pattern, which expose the first pixel electrode, by partially removing the first photoresist layer, the first upper lift-off layer, and the first lower lift-off layer; forming a first light emitting layer and a first counter electrode on the first pixel electrode by using the first masking layer; forming a first passivation layer on the first counter electrode; and removing the first masking layer.

In one or more embodiments, in the forming of the first masking layer, an under-cut profile may be formed at ends of the first photoresist pattern and the first upper lift-off pattern, and an under-cut profile may be formed between the first upper lift-off pattern and the first lower lift-off pattern, so that a double under-cut profile may be formed in the first masking layer.

In one or more embodiments, in the forming of the first passivation layer, the first passivation layer may be formed on the first counter electrode and the first masking layer, and the first passivation layer may have an opening area that partially exposes a bottom surface of the first upper lift-off pattern.

In one or more embodiments, the substrate on which the first pixel electrode is formed may include: a circuit element layer disposed between the first pixel electrode and the substrate and including a pixel circuit, a pixel defining layer disposed on the circuit element layer and having an opening that exposes the first pixel electrode, and a connection electrode disposed on the pixel defining layer.

In one or more embodiments, at an end of the first upper lift-off pattern, a first separation distance between the connection electrode and the first upper lift-off pattern may be smaller than a second separation distance between the connection electrode and a portion of the first upper lift-off pattern adjacent to a side surface of the first lower lift-off pattern.

In one or more embodiments, an end of each of the first light emitting layer and the first counter electrode may have a forward taper shape, and the end of the first counter electrode may extend farther towards the connection electrode than the end of the first light emitting layer to contact the connection electrode.

In one or more embodiments, in the removing of the first masking layer, the first upper and first lower lift-off patterns may be removed by using a stripper, so that the first light emitting layer, the first counter electrode, and the first passivation layer, which are configured to have an island shape, may remain on the first pixel electrode to form a first organic light emitting diode including the first pixel electrode, the first light emitting layer, and the first counter electrode.

In one or more embodiments, the method may further include: forming a second lower lift-off layer, a second upper lift-off layer, and a second photoresist layer on the substrate on which the first passivation layer and a second pixel electrode are formed: forming a second masking layer including a second photoresist pattern, a second upper lift-off pattern, and a second lower lift-off pattern, which expose the second pixel electrode, by partially removing the second photoresist layer, the second upper lift-off layer, and the second lower lift-off layer; forming a second light emitting layer and a second counter electrode on the second pixel electrode by using the second masking layer; forming a second passivation layer on the second counter electrode; and removing the second masking layer. The first light emitting layer may include an organic light emitting layer configured to emit a first color light, and the second light emitting layer may include an organic light emitting layer configured to emit a second color light that is different from the first color light.

In one or more embodiments, the substrate on which the first pixel electrode is formed may further include: a circuit element layer disposed between the first pixel electrode and the substrate, and including a pixel circuit; a pixel defining layer disposed on the circuit element layer and having an opening that exposes the first pixel electrode; and a connection electrode disposed on the pixel defining layer. The first counter electrode and the second counter electrode may be electrically connected to the connection electrode.

In one or more embodiments, the forming of the first masking layer may include: forming the first photoresist pattern by exposing and developing the first photoresist layer; and forming the first upper lift-off pattern and the first lower lift-off pattern by etching the first upper lift-off layer and the first lower lift-off layer by using a same etching solution while using the first photoresist pattern as an etch barrier. An etch selectivity of the first lower lift-off layer may be higher than an etch selectivity of the first upper lift-off layer with respect to the etching solution.

In one or more embodiments, the forming of the first masking layer may include: forming the first photoresist pattern by exposing and developing the first photoresist layer; forming the first upper lift-off pattern by etching the first upper lift-off layer by using the first photoresist pattern as an etch barrier; and forming the first lower lift-off pattern by etching the first lower lift-off layer by using the first photoresist pattern and the first upper lift-off pattern as etch barriers.

In one or more embodiments, the forming of the first masking layer may include: exposing the first photoresist layer; and concurrently forming the first photoresist pattern, the first upper lift-off pattern, and the first lower lift-off pattern by developing the first photoresist layer while etching the first upper lift-off layer and the first lower lift-off layer by using a developing and etching solution.

In one or more embodiments, the first light emitting layer and the first counter electrode may be formed through an evaporation scheme (e.g., through an evaporation process). In addition, the first passivation layer may be formed through a chemical vapor deposition scheme (e.g., through a chemical vapor deposition process). Further, a step coverage of the chemical vapor deposition scheme for forming the first passivation layer may be greater than a step coverage of the evaporation scheme for forming the first light emitting layer and the first counter electrode.

In one or more embodiments, the first passivation layer may include an inorganic insulating material.

In one or more embodiments, a sum of a thickness of the first lower lift-off pattern and a thickness of the first upper lift-off pattern may be less than or equal to 1.2 um (micrometer).

According to one or more embodiments, a method of manufacturing a display apparatus includes: forming a first masking layer including a first lower lift-off pattern and a first upper lift-off pattern on a substrate; forming a first light emitting layer and a first passivation layer by using the first masking layer; removing the first masking layer by using a lift-off process; forming a second masking layer including a second lower lift-off pattern and a second upper lift-off pattern on the substrate on which the first light emitting layer and the first passivation layer are formed; forming a second light emitting layer and a second passivation layer by using the second masking layer; and removing the second masking layer by using the lift-off process.

In one or more embodiments, an under-cut profile may be formed between the first upper lift-off pattern and the first lower lift-off pattern.

In one or more embodiments, the first masking layer may further include a first photoresist pattern disposed on the first upper lift-off pattern. An under-cut profile may be formed at ends of the first photoresist pattern and the first upper lift-off pattern, so that a double under-cut profile may be formed in the first masking layer.

In one or more embodiments, an etch selectivity of the first lower lift-off pattern may be higher than an etch selectivity of the first upper lift-off pattern with respect to a same etching solution.

In one or more embodiments, the forming of the first masking layer may include: forming a first lower lift-off layer, a first upper lift-off layer, and a first photoresist layer; forming the first photoresist pattern by exposing and developing the first photoresist layer; forming the first upper lift-off pattern by etching the first upper lift-off layer by using the first photoresist pattern as an etch barrier; and forming the first lower lift-off pattern by etching the first lower lift-off layer by using the first photoresist pattern and the first upper lift-off pattern as etch barriers.

Effects of the Invention

According to embodiments of the present disclosure, a method of manufacturing a display apparatus may include: forming a first lower lift-off layer, a first upper lift-off layer, and a first photoresist layer on a substrate on which a first pixel electrode is formed; forming a first masking layer including a first photoresist pattern, a first upper lift-off pattern, and a first lower lift-off pattern, which exposes the first pixel electrode, by partially removing the first photoresist layer, the first upper lift-off layer, and the first lower lift-off layer; forming a first light emitting layer and a first counter electrode on the first pixel electrode by using the first masking layer; forming a first passivation layer on the first counter electrode; and removing the first masking layer. An under-cut profile may be formed on the first masking layer, and a lift-off process of removing the first masking layer may be performed by dissolving the first lower lift-off pattern and the first upper lift-off pattern of the first masking layer by a stripper. Here, because the stripper dissolves the first upper lift-off pattern and the first lower lift-off pattern through an opening area that is an area in which the first passivation layer is not formed on a surface of the first masking layer, the lift-off process may be easily performed.

However, the effects of the present disclosure are not limited thereto. Thus, the effects of the present disclosure may be extended without departing from the spirit and the scope of the present disclosure.

BRIEF DESCRIPTION OF THE DRAWINGS

The above and other aspects and features of the present disclosure will become more apparent to those skilled in the art from the following detailed description of the example embodiments with reference to the accompanying drawings.

FIGS. 1A-1I are cross-sectional views illustrating a method of manufacturing a display apparatus according to embodiments.

FIGS. 5A-5E are cross-sectional views illustrating a method of manufacturing a display apparatus according to embodiments.

PARTICULAR CONTENTS FOR IMPLEMENTING THE INVENTION

Figure 1B:
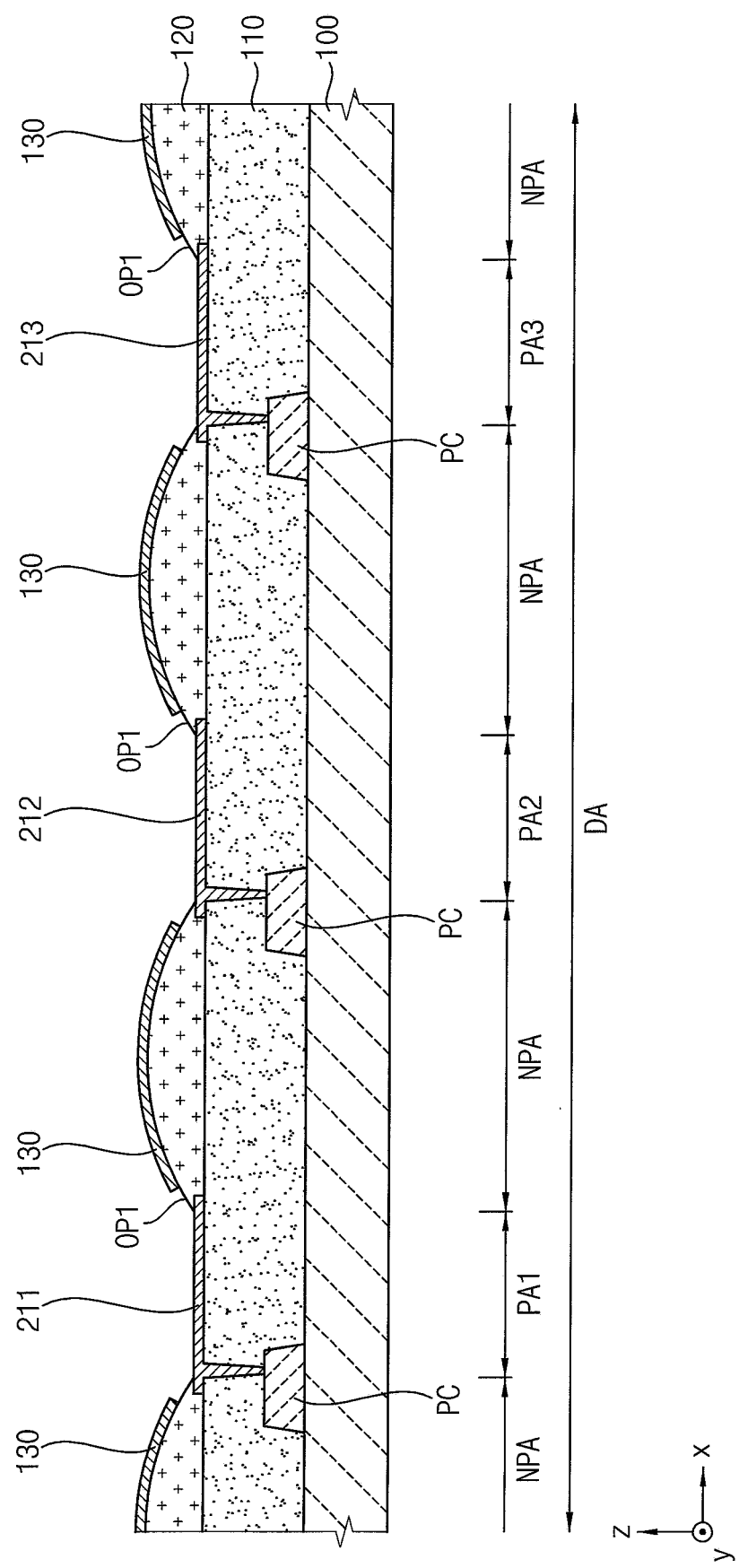

Hereinafter, embodiments of the present disclosure will be described in more detail with reference to the accompanying drawings.

FIGS. 1A to 1I are cross-sectional views illustrating a method of manufacturing a display apparatus according to embodiments.

Referring to FIG. 1A, a circuit element layer 110 including a pixel circuit PC may be formed on a substrate 100, and first to third pixel electrodes 211, 212, and 213 may be formed on the circuit element layer 110. The first to third pixel electrodes 211, 212, and 213 may correspond to first to third pixel areas PA1, PA2, and PA3, respectively. For example, a preliminary pixel electrode layer may be formed on the circuit element layer 110, and the preliminary pixel electrode layer may be patterned to form the first to third pixel electrodes 211, 212, and 213.

In this case, the substrate 100 may include various suitable materials, for example, such as a glass material or a plastic material. The plastic material may include, for example, polyethylene terephthalate (PET), polyethylene naphthalate (PEN), and/or polyimide. When the substrate 100 is formed of a plastic material, flexibility thereof may be improved as compared with a case where the substrate 100 is formed of a glass material.

The pixel circuit PC may include a thin film transistor and a storage capacitor. Layers constituting the thin film transistor and the storage capacitor may include, for example, a semiconductor layer and an electrode layer with an insulating layer interposed therebetween.

The first to third pixel electrodes 211, 212, and 213 may be reflective electrodes or transmissive electrodes.

In a case where the first to third pixel electrodes 211, 212, and 213 are reflective electrodes, the first to third pixel electrodes 211, 212, and 213 may include a reflective film formed of Ag, Mg, Al, Pt, Pd, Au, Ni, Nd, Ir, Cr, or a compound thereof. As another example, the first to third pixel electrodes 211, 212, and 213 may include the above-described reflective film and a transparent conductive oxide (TCO) film disposed on and/or under the reflective film. As an example embodiment, the first to third pixel electrodes 211, 212, and 213 may have three layers of ITO/Ag/ITO.

In a case where the first to third pixel electrodes 211, 212, and 213 are transmissive electrodes, the first to third pixel electrodes 211, 212, and 213 may include transparent conductive oxide (TCO) layers. As another example, the first to third pixel electrodes 211, 212, and 213 may include metal thin films including, for example, silver (Ag) or a silver (Ag) alloy, or may include multiple transparent conductive oxide layers formed on the above-described metal thin films.

Thereafter, an insulating material layer may be formed on the first to third pixel electrodes 211, 212, and 213, and the insulating material layer may be patterned to form a pixel defining layer 120 having openings OP1 that expose the first to third pixel electrodes 211, 212, and 213, respectively. An insulating material constituting the pixel defining layer 120 may include an organic material. As another embodiment, the insulating material constituting the pixel defining layer 120 may include an inorganic material, or may include an inorganic material and an organic material.

Referring to FIG. 1B, a connection electrode 130 may be formed at (e.g., in or on) a non-pixel area NPA. The connection electrode 130 may include a conductive material, for example, such as a metal, a transparent conductive oxide (TCO), or the like, and may be configured (e.g., formed) as a single layer or multiple layers.

Various suitable schemes (e.g., various suitable processes or methods) may be used to form the connection electrode 130. As an example embodiment, after a conductive material layer is formed, the connection electrode 130 may be formed on the pixel defining layer 120 at (e.g., in or on) the non-pixel area NPA through a photolithography process and a wet or dry etching process of the conductive material layer. In the etching process, dry etching may be performed for precise patterning. In this case, in order to prevent or substantially prevent the first to third pixel electrodes 211, 212, and 213 from being damaged, a conductive material constituting the connection electrode 130 may include a material having an etch selectivity that is different from an etch selectivity of a material of the first to third pixel electrodes 211, 212, and 213.

As another embodiment, the connection electrode 130 may be formed by forming a masking layer including a positive or negative resist material at a portion where the connection electrode 130 is to be located, and depositing a conductive material by a suitable scheme (e.g., by a suitable process), for example, such as thermal evaporation. In this case, because the first to third pixel electrodes 211, 212, and 213 are covered with the masking layer, unlike in the above-described dry etching scheme (e.g., dry etching process), the first to third pixel electrodes 211, 212, and 213 may not be damaged during the process of forming the connection electrode 130. Accordingly, the conductive material constituting the connection electrode 130 may include the same or substantially the same material as those of the first to third pixel electrodes 211, 212, and 213.

Figure 1C:
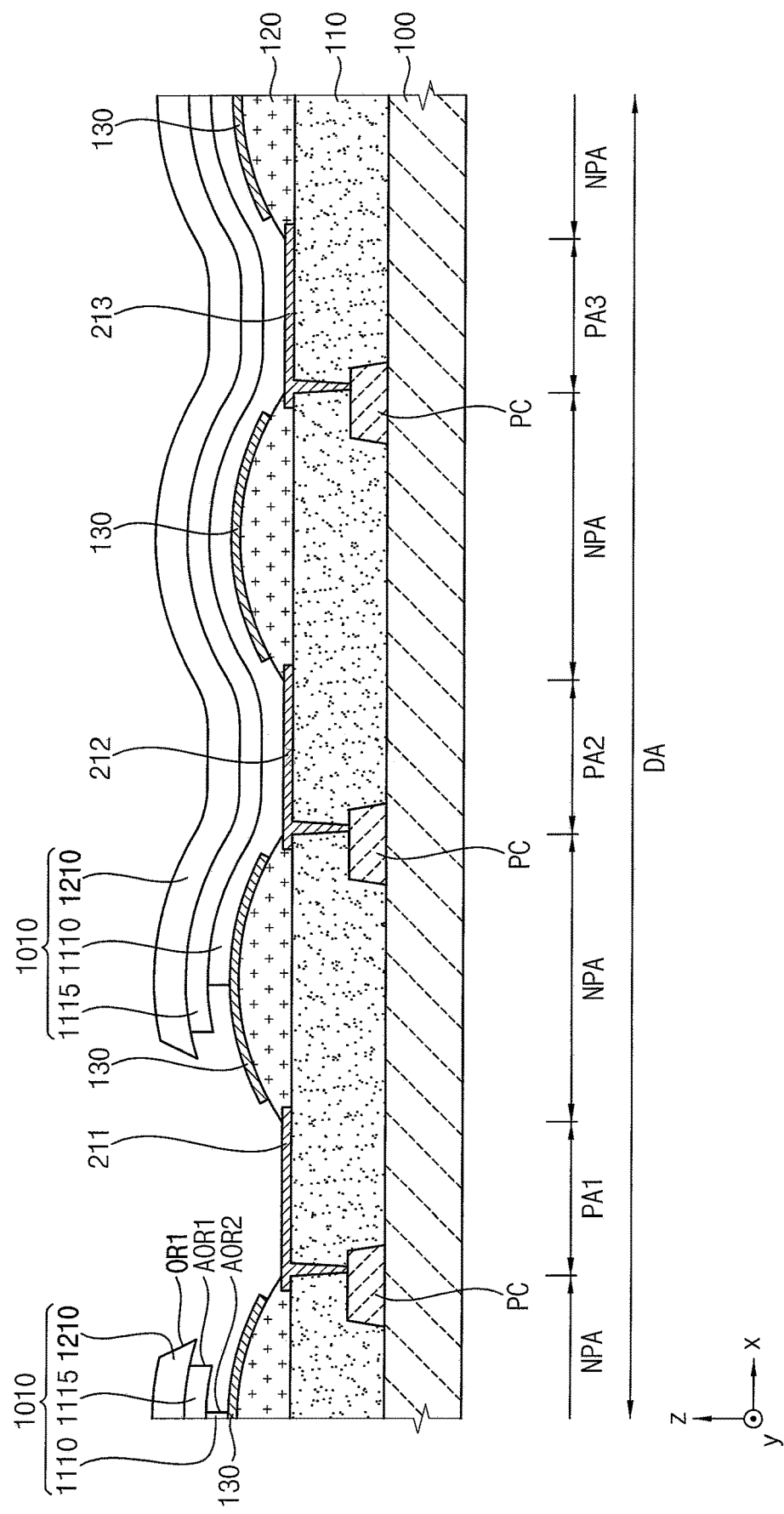

Referring to FIG. 1C, a first masking layer 1010 having an opening corresponding to the first pixel area PA1 may be formed. The first masking layer 1010 may include: a first photoresist pattern 1210; a first lower lift-off pattern 1110; and a first upper lift-off pattern 1115. The first lower lift-off pattern 1110 and the first upper lift-off pattern 1115 may be disposed between the first photoresist pattern 1210 and the pixel defining layer 120.

In an embodiment, the first masking layer 1010 may be formed by the following process.

A lower lift-off layer and an upper lift-off layer may be formed on the substrate 100 on which the connection electrode 130 is formed, and a photoresist layer may be formed on the lower lift-off layer and the upper lift-off layer. The lower lift-off layer and the upper lift-off layer may include a non-photosensitive organic material, for example, such as a fluorine-based material, but the present disclosure is not limited thereto. The photoresist layer may include a positive photosensitive material.

In this case, constituent materials of the first lower lift-off layer and the first upper lift-off layer may be composed to have mutually different solubilities with respect to the same etching solution. In other words, the lower lift-off layer and the upper lift-off layer may have mutually different etch selectivities with respect to the same etching solution. As another example, the constituent materials of the first lower lift-off layer and the first upper lift-off layer may be composed to be etched by mutually different etching solutions.

Thereafter, the first photoresist pattern 1210 having a first opening region OR1 may be formed by exposing and developing a partial area of the photoresist layer corresponding to the first pixel area PA1. Next, the first upper lift-off pattern 1115 having a first auxiliary opening region AOR1 and the first lower lift-off pattern 1110 having a second auxiliary opening region AOR2 may be formed by etching the first upper lift-off layer and the first lower lift-off layer, respectively, that are exposed through the first opening region OR1. In this case, the first auxiliary opening region AOR1 of the first upper lift-off pattern 1115 may be larger than the first opening region OR1, and the second auxiliary opening region AOR2 of the first lower lift-off pattern 1110 may be larger than the first auxiliary opening region AOR1.

In other words, an under-cut profile may be formed at ends of the first photoresist pattern 1210 and the first upper lift-off pattern 1115, and an under-cut profile may be formed at ends of the first upper lift-off pattern 1115 and the first lower lift-off pattern 1110.

In this case, the first lower lift-off pattern 1110 may be disposed on the connection electrode 130, such that the first lower lift-off pattern 1110 does not cover an end of the connection electrode 130 so as to expose the end of the connection electrode 130 (e.g., an exposed end of the connection electrode 130 that is adjacent to the first pixel electrode 211). The first lower lift-off pattern 1110 may cover an opposite end of the connection electrode 130 that is opposite to the exposed end.

Figure 1D:
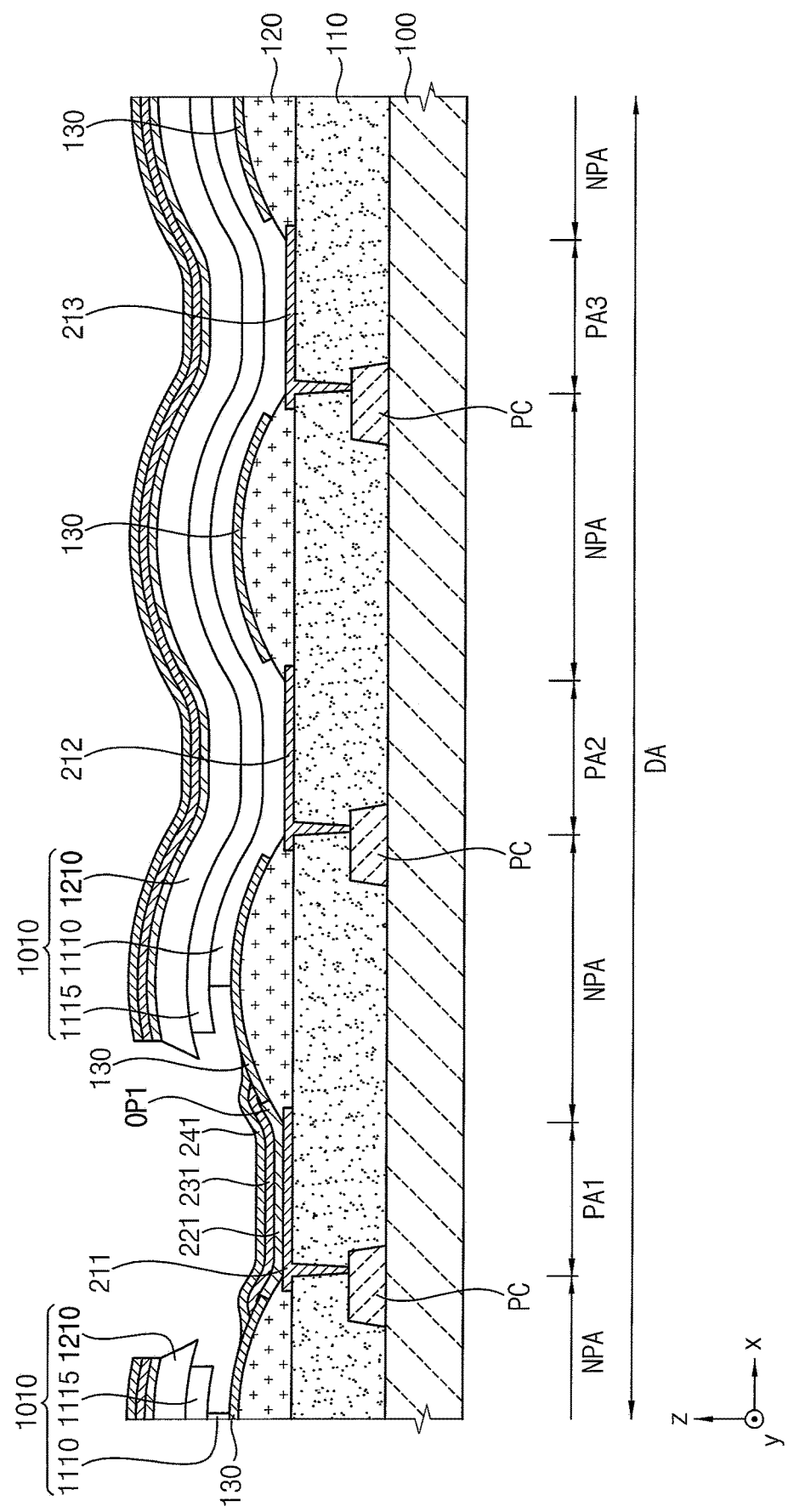
Figure 1E:
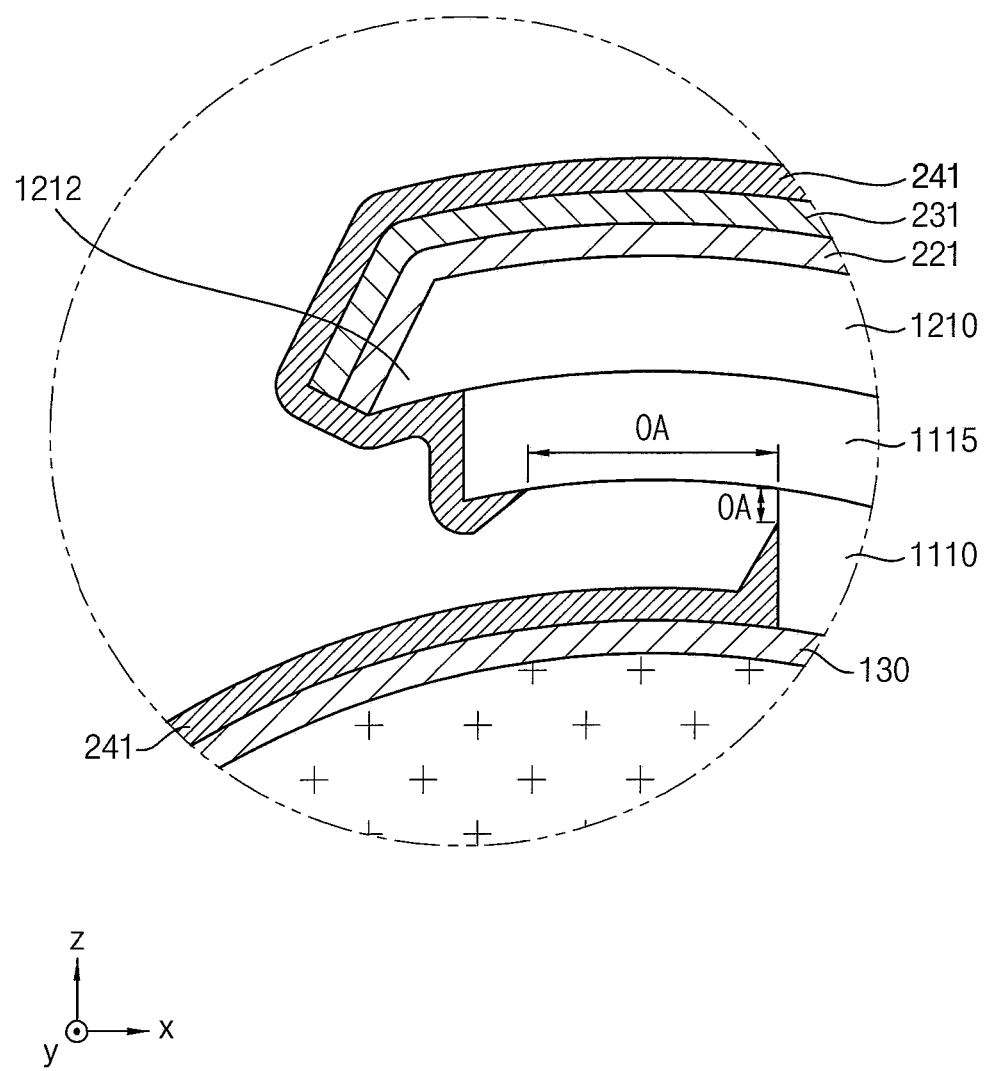
Figure 5A:
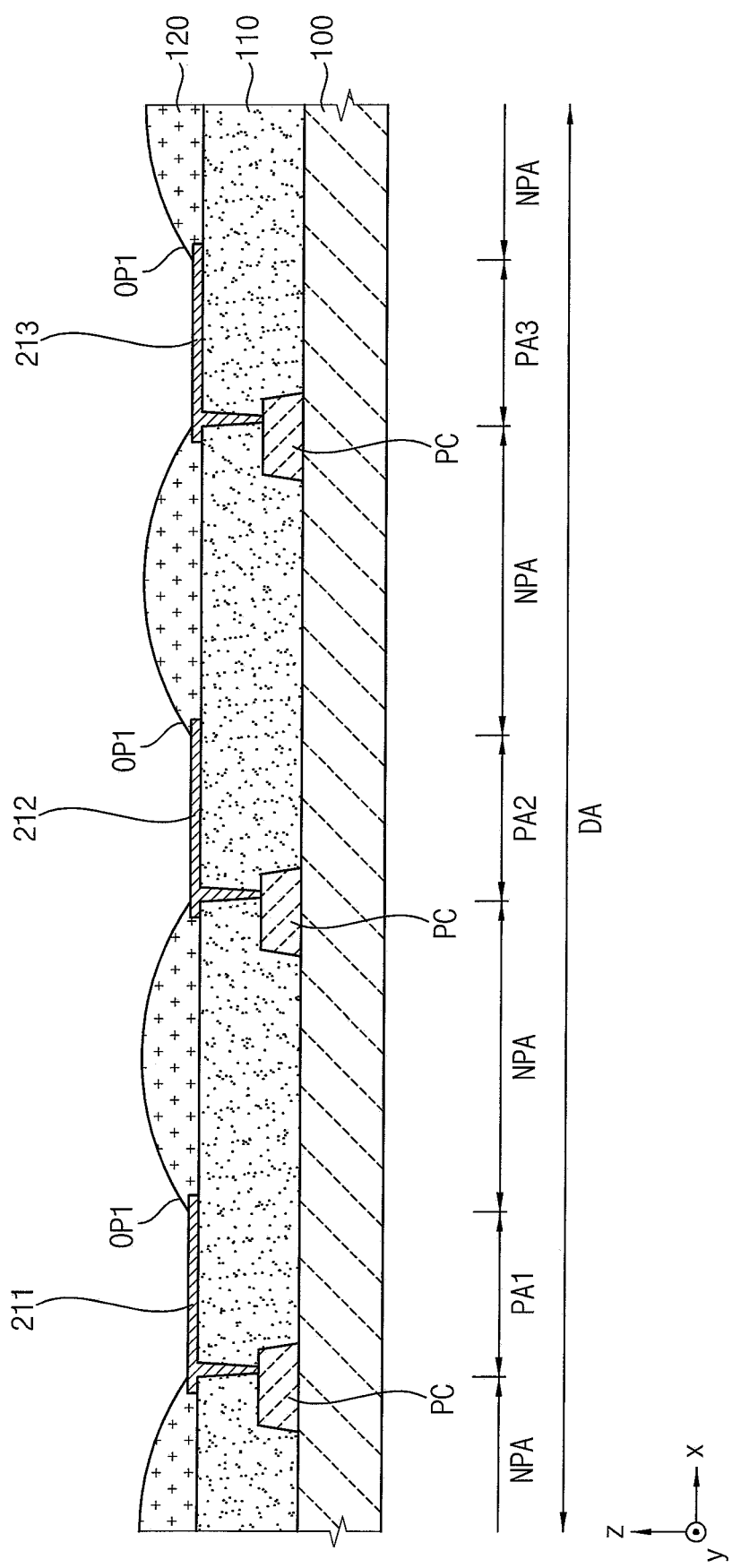
Figure 5D:
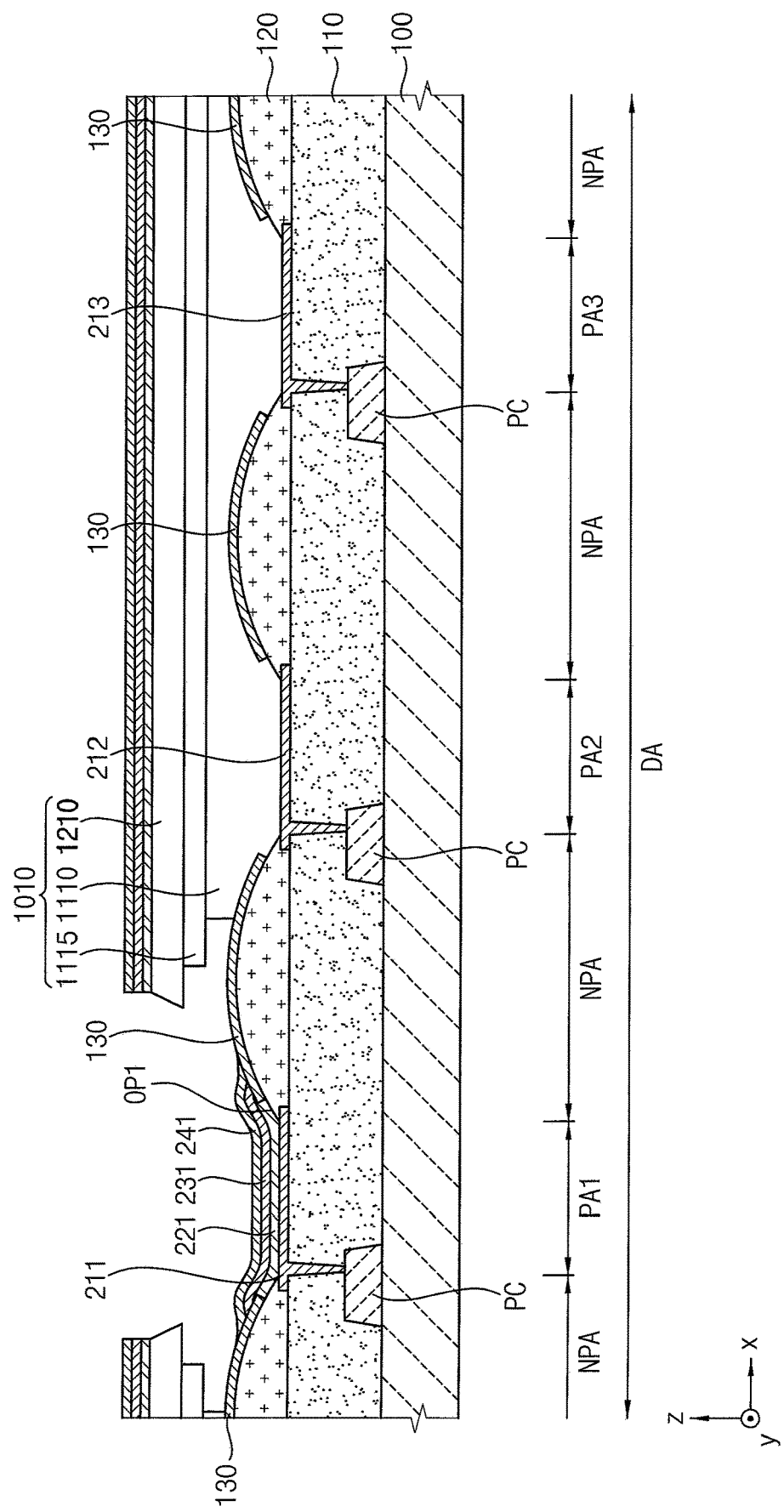

Although the first masking layer 1010 is shown in FIGS. 1C to 1E as being curved along a profile of a constituent material disposed on the substrate 100 so as to have a top surface that is not flat, the present disclosure is not limited thereto, and the first masking layer 1010 may be sufficiently thick as compared with a profile of the constituent material, such that the first masking layer 1010 may have a flat or substantially flat top surface (e.g., see the embodiment of FIG. 5D).

Referring to FIGS. 1D and 1E, a first light emitting layer 221, a first counter electrode 231, and a first passivation layer 241 may be sequentially formed on the substrate 100 on which the first masking layer 1010 is formed. In this case, FIG. 1E is a partially enlarged view showing an end of the first masking layer 1010 of FIG. 1D, in which a shape of the first passivation layer 241 is shown in more detail.

The first light emitting layer 221 and the first counter electrode 231 may be formed by a thermal evaporation scheme (e.g., a thermal evaporation process). Deposition materials used for forming the first light emitting layer 221 and the first counter electrode 231 may move (e.g., may be deposited) toward the substrate 100 in a direction perpendicular to or substantially perpendicular to a top surface of the substrate 100 and in a direction oblique to the top surface of the substrate 100. Accordingly, an end of the first light emitting layer 221 and an end of the first counter electrode 231 may extend into a space under the first photoresist pattern 1210 without making contact with the first upper lift-off pattern 1115 and the first lower lift-off pattern 1110. As the deposition material is deposited in the oblique direction, the ends of the first light emitting layer 221 and the first counter electrode 231 may have a forward taper shape, and the end of the first counter electrode 231 may extend more towards the end of the first masking layer 1010 than the end of the first light emitting layer 221 so as to make contact with the connection electrode 130, such that the first counter electrode 231 may have a width (e.g., in an x direction) that is greater than a width (e.g., in the x direction) of the first light emitting layer 221. The first counter electrode 231 may make direct contact with a top surface of the connection electrode 130, and the first counter electrode 231 may be electrically and directly connected to the connection electrode 130.

The first light emitting layer 221 may include an organic light emitting layer configured to emit a first color light. The organic light emitting layer may be, for example, an organic light emitting layer configured to emit a red colored light.

The first counter electrode 231 may be a transmissive electrode or a reflective electrode. The first counter electrode 231 may include a metal thin film or a metal thick film including, for example, at least one of Ag, Mg, Al, Yb, Ca, Li, or Au. For example, the first counter electrode 231 may be configured as a single layer or multiple layers including at least one of Ag, Mg, Al, Yb, Ca, LiF/Ca, LiF/Al, Al, or Au. In an embodiment, the first counter electrode 231 may include a metal thin film including Ag and Mg, and may contain more Ag than Mg.

In another embodiment, the first counter electrode 231 including one or more of the above-described materials may be formed as a light-transmissive electrode by decreasing a thickness of the first counter electrode 231, or may be formed as a reflective electrode by increasing the thickness of the first counter electrode 231. For example, a metal including Ag and Mg may be used as a light-transmissive electrode by configuring the metal to have a thickness of about 10 Å to 15 Å, or the metal may be used as a reflective electrode by configuring the metal to have a thickness of about 50 nm or more.

The first passivation layer 241 may include an inorganic insulating material, for example, such as silicon oxide ($SiO_x$), silicon nitride ($SiN_x$), and/or silicon oxynitride (SiON), and may be configured as a single layer or multiple layers.

In an embodiment, the first passivation layer 241 may be formed by a chemical vapor deposition (CVD) scheme (e.g., a CVD process). In this case, a step coverage of the chemical vapor deposition (CVD) scheme for forming the first passivation layer 241 may be greater than a step coverage of an evaporation process for forming the first light emitting layer 221 and the first counter electrode 231. Therefore, the first passivation layer 241 may be formed on a top surface of the first photoresist pattern 1210, and on top surfaces of the first counter electrode 231 and the connection electrode 130. The first passivation layer 241 may also be formed on an inclined surface (e.g., 1212 in FIG. 1E) of an end of the first photoresist pattern 1210, a bottom surface of the end of the first photoresist pattern 1210, a side surface of the first upper lift-off pattern 1115, a part of a bottom surface of the first upper lift-off pattern 1115, and a part of a side surface of the first lower lift-off pattern 1110.

Although the first passivation layer 241 is shown in FIG. 1D as being formed only on a top surface of the first masking layer 1010, referring to FIG. 1E, the first passivation layer 241 may also be deposited on a part of a side surface of the first masking layer 1010 as described above.

According to the present embodiment, because a double under-cut profile is formed at the ends of the first photoresist pattern 1210, the first upper lift-off pattern 1115, and the first lower lift-off pattern 1110, even when the step coverage of the chemical vapor deposition (CVD) scheme for forming the first passivation layer 241 is large, an opening area OA in which the first passivation layer 241 is not formed may be formed at a part of the bottom surface of the first upper lift-off pattern 1115 and a part of the side surface of the first lower lift-off pattern 1110.

An end of the first passivation layer 241 may have a forward taper shape. In order to prevent or substantially prevent the first counter electrode 231 and the layers under the first counter electrode 231 from being damaged in a process that will be described in more detail below, the first passivation layer 241 may have a width (e.g., in the x direction) that is greater than the width (e.g., in the x direction) of the first counter electrode 231.

Thereafter, referring to FIG. 1F, the first masking layer 1010 may be removed through a lift-off process. In an embodiment, when the first upper and first lower lift-off patterns 1115 and 1110 are formed of fluorine-based materials, the first upper and first lower lift-off patterns 1115 and 1110 may be removed by using a fluorine-based solvent as a stripper. As the first upper and first lower lift-off patterns 1115 and 1110 are removed, the first photoresist pattern 1210 disposed on the first upper lift-off pattern 1115 may be removed together with portions of the first light emitting layer 221, the first counter electrode 231, and the first passivation layer 241 that are stacked on the first photoresist pattern 1210. In addition, the first light emitting layer 221, the first counter electrode 231, and the first passivation layer 241, which are configured to have an island shape, may remain at (e.g., in or on) the first pixel area PA1.

However, constituent materials of the first upper and first lower lift-off patterns 1115 and 1110 are not limited to a fluorine-based material, such that the lift-off process may be performed by using an appropriate stripper according to the constituent materials of the first upper and first lower lift-off patterns 1115 and 1110.

In addition, as shown in FIG. 1E, because the stripper may dissolve the first upper and first lower lift-off patterns 1115 and 1110 through the opening area OA formed at the bottom and side surfaces of the first upper and first lower lift-off patterns 1115 and 1110, respectively, the lift-off process may be easily performed.

During the lift-off process, the first passivation layer 241 may protect or substantially protect a first organic light emitting diode including the first pixel electrode 211, the first light emitting layer 221, and the first counter electrode 231. When the first masking layer 1010 is lifted off, a material included in the fluorine-based solvent may be prevented or substantially prevented from penetrating into the first organic light emitting diode to damage the first organic light emitting diode.

Figure 1G:
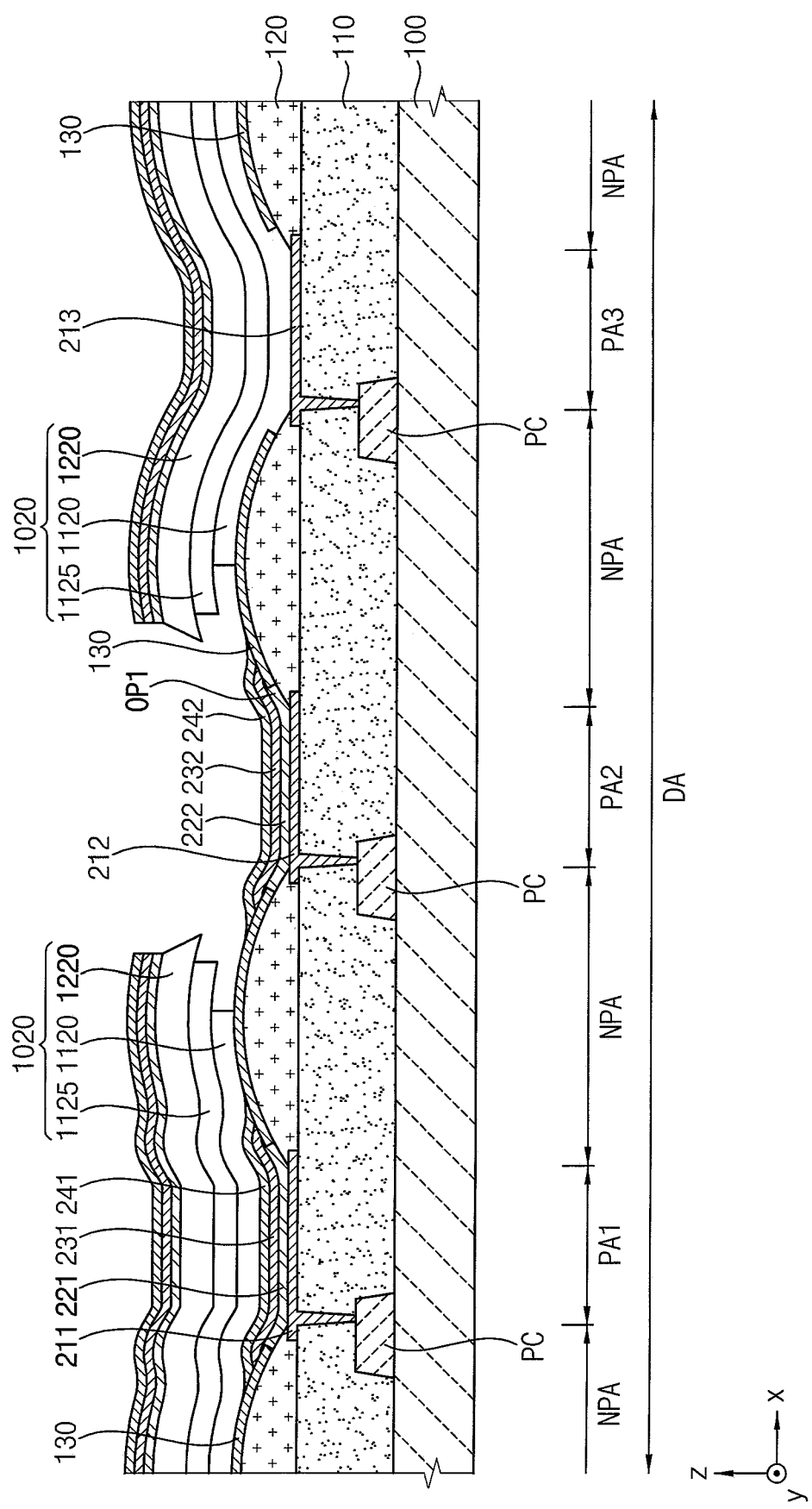

Referring to FIG. 1G, a second masking layer 1020 having an opening corresponding to the second pixel area PA2 may be formed. The second masking layer 1020 may include: a second photoresist pattern 1220; a second lower lift-off pattern 1120; and a second upper lift-off pattern 1125. The second lower lift-off pattern 1120 and the second upper lift-off pattern 1125 may be disposed between the second photoresist pattern 1220 and the pixel defining layer 120. The second lower lift-off pattern 1120, the second upper lift-off pattern 1125, and the second photoresist pattern 1220 may include the same or substantially the same material as those of the first lower lift-off pattern 1110, the first upper lift-off pattern 1115, and the first photoresist pattern 1210 described above, respectively, and may be formed by the same or substantially the same process as those of the first lower lift-off pattern 1110, the first upper lift-off pattern 1115, and the first photoresist pattern 1210, respectively.

Next, a second light emitting layer 222, a second counter electrode 232, and a second passivation layer 242 may be sequentially formed on the substrate 100 on which the second masking layer 1020 is formed.

The second light emitting layer 222 and the second counter electrode 232 may be formed by the thermal evaporation scheme. Deposition materials used for forming the second light emitting layer 222 and the second counter electrode 232 may move (e.g., may be deposited) toward the substrate 100 in the direction perpendicular to or substantially perpendicular to the top surface of the substrate 100 and in the direction oblique to the top surface of the substrate 100. Accordingly, an end of the second light emitting layer 222 and an end of the second counter electrode 232 may extend into a space under the second photoresist pattern 1220 without making contact with the second upper lift-off pattern 1125 and the second lower lift-off pattern 1120. As the deposition material is deposited in the oblique direction, the ends of the second light emitting layer 222 and the second counter electrode 232 may have a forward taper shape, and the end of the second counter electrode 232 may extend more towards the end of the second masking layer 1020 than the end of the second light emitting layer 222 so as to make contact with the connection electrode 130, such that the second counter electrode 232 may have a width (e.g., in the x direction) that is greater than a width (e.g., in the x direction) of the second light emitting layer 222. The second counter electrode 232 may make direct contact with the top surface of the connection electrode 130, and the second counter electrode 232 may be electrically and directly connected to the connection electrode 130.

The second light emitting layer 222 may include an organic light emitting layer configured to emit a second color light that is different from the first color light. The organic light emitting layer may be, for example, an organic light emitting layer configured to emit a green colored light.

The second counter electrode 232 may be a transmissive electrode or a reflective electrode. A specific constituent material and/or a manufacturing scheme (e.g., a manufacturing process or method) of the second counter electrode 232 may be the same or substantially the same as (or similar) to the constituent material and/or the manufacturing scheme of the first counter electrode 231 described above. Therefore, redundant descriptions thereof may not be repeated.

The second passivation layer 242 may include an inorganic insulating material, for example, such as silicon oxide ($SiO_x$), silicon nitride ($SiN_x$), and/or silicon oxynitride (SiON), and may be configured as a single layer or multiple layers.

In an embodiment, the second passivation layer 242 may be formed by the chemical vapor deposition (CVD) scheme. In this case, a step coverage of the chemical vapor deposition (CVD) scheme for forming the second passivation layer 242 may be greater than a step coverage of an evaporation process for forming the second light emitting layer 222 and the second counter electrode 232. Therefore, the second passivation layer 242 may be formed on a top surface of the second photoresist pattern 1220, and on top surfaces of the second counter electrode 232 and the connection electrode 130. The second passivation layer 242 may also be formed on an inclined surface of an end of the second photoresist pattern 1220, a bottom surface of the end of the second photoresist pattern 1220, a side surface of the second upper lift-off pattern 1125, a part of a bottom surface of the second upper lift-off pattern 1125, and a part of a side surface of the second lower lift-off pattern 1120.

Although the second passivation layer 242 is shown in FIG. 1G as being formed only on a top surface of the second masking layer 1020, similar to the case of the first passivation layer 241 shown in FIG. 1E, the second passivation layer 242 may also be deposited on a part of a side surface of the second masking layer 1020. Thus, redundant detailed descriptions thereof may not be repeated.

The second passivation layer 242 may have a width (e.g., in the x direction) that is greater than a width (e.g., in the x direction) of the second counter electrode 232, so that the second counter electrode 232 and the layers under the second counter electrode 232 may be prevented or substantially prevented from being damaged in a process that will be described in more detail below.

Thereafter, the second masking layer 1020 may be removed through a lift-off process. In addition, the second light emitting layer 222, the second counter electrode 232, and the second passivation layer 242, which are configured to have an island shape, may remain at (e.g., in or on) the second pixel area PA2. Because the lift-off process is the same or substantially the same as (or similar to) the lift-off process of the first masking layer 1010, redundant descriptions thereof may not be repeated.

Figure 1H:
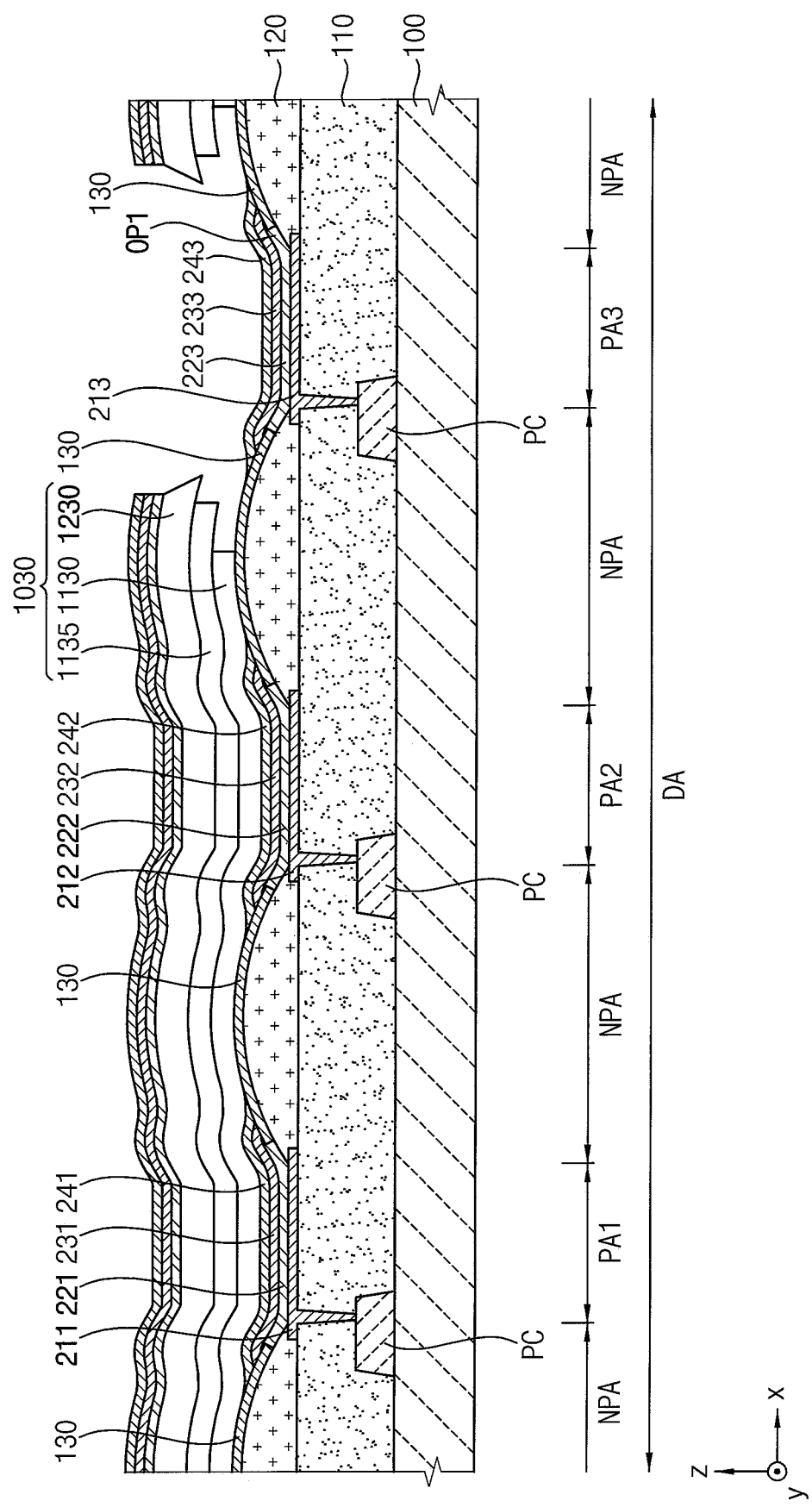

Referring to FIG. 1H, a third masking layer 1030 having an opening corresponding to the third pixel area PA3 may be formed. The third masking layer 1030 may include: a third photoresist pattern 1230; a third lower lift-off pattern 1130; and a third upper lift-off pattern 1135. The third lower lift-off pattern 1130 and the third upper lift-off pattern 1135 may be disposed between the third photoresist pattern 1230 and the pixel defining layer 120. The third lower lift-off pattern 1130, the third upper lift-off pattern 1135, and the third photoresist pattern 1230 may include the same or substantially the same material as those of the first lower lift-off pattern 1110, the first upper lift-off pattern 1115, and the first photoresist pattern 1210 described above, respectively, and may be formed by the same or substantially the same process as those of the first lower lift-off pattern 1110, the first upper lift-off pattern 1115, and the first photoresist pattern 1210, respectively.

Next, a third light emitting layer 223, a third counter electrode 233, and a third passivation layer 243 may be sequentially formed on the substrate 100 on which the third masking layer 1030 is formed.

The third light emitting layer 223 and the third counter electrode 233 may be formed by the thermal evaporation scheme. Deposition materials used for forming the third light emitting layer 223 and the third counter electrode 233 may move (e.g., may be deposited) toward the substrate 100 in the direction perpendicular to or substantially perpendicular to the top surface of the substrate 100 and in the direction oblique to the top surface of the substrate 100. Accordingly, an end of the third light emitting layer 223 and an end of the third counter electrode 233 may extend into a space under the third photoresist pattern 1230 without making contact with the third upper lift-off pattern 1135 and the third lower lift-off pattern 1130. As the deposition material is deposited in the oblique direction, the ends of the third light emitting layer 223 and the third counter electrode 233 may have a forward taper shape, and the end of the third counter electrode 233 may extend more towards the end of the third masking layer 1030 than the end of the third light emitting layer 223 so as to make contact with the connection electrode 130, such that the third counter electrode 233 may have a width (e.g., in the x direction) that is greater than a width (e.g., in the x direction) of the third light emitting layer 223. The third counter electrode 233 may make direct contact with the top surface of the connection electrode 130, and the third counter electrode 233 may be electrically and directly connected to the connection electrode 130.

The third light emitting layer 223 may include an organic light emitting layer configured to emit a third color light that is different from the first color light and the second color light. The organic light emitting layer may be, for example, an organic light emitting layer configured to emit a blue colored light.

The third counter electrode 233 may be a transmissive electrode or a reflective electrode. A specific constituent material and/or a manufacturing scheme (e.g., a manufacturing process or method) of the third counter electrode 233 may be the same or substantially the same as (or similar to) the constituent material and/or the manufacturing scheme of the first counter electrode 231. Therefore, redundant descriptions thereof may not be repeated.

The third passivation layer 243 may include an inorganic insulating material, for example, such as silicon oxide ($SiO_x$), silicon nitride ($SiN_x$), and/or silicon oxynitride ($SiON$), and may be configured as a single layer or multiple layers.

In an embodiment, the third passivation layer 243 may be formed by the chemical vapor deposition (CVD) scheme. In this case, a step coverage of the chemical vapor deposition (CVD) scheme for forming the third passivation layer 243 may be greater than a step coverage of an evaporation process for forming the third light emitting layer 223 and the third counter electrode 233. Therefore, the third passivation layer 243 may be formed on a top surface of the third photoresist pattern 1230, and top surfaces of the third counter electrode 233 and the connection electrode 130. The third passivation layer 243 may also be formed on an inclined surface of an end of the third photoresist pattern 1230, a bottom surface of the end of the third photoresist pattern 1230, a side surface of the third upper lift-off pattern 1135, a part of a bottom surface of the third upper lift-off pattern 1135, and a part of a side surface of the third lower lift-off pattern 1130.

Although the third passivation layer 243 is shown in FIG. 1H as being formed only on a top surface of the third masking layer 1030, similar to the case of the first passivation layer 241 shown in FIG. 1E, the third passivation layer 243 may also be deposited on a part of a side surface of the third masking layer 1030. Thus, redundant detailed descriptions thereof may not be repeated.

The third passivation layer 243 may have a width (e.g., in the x direction) that is greater than a width (e.g., in the x direction) of the third counter electrode 233, so that the third counter electrode 233 and the layers under the third counter electrode 233 may be prevented or substantially prevented from being damaged in a process that will be described in more detail below.

Figure 1I:
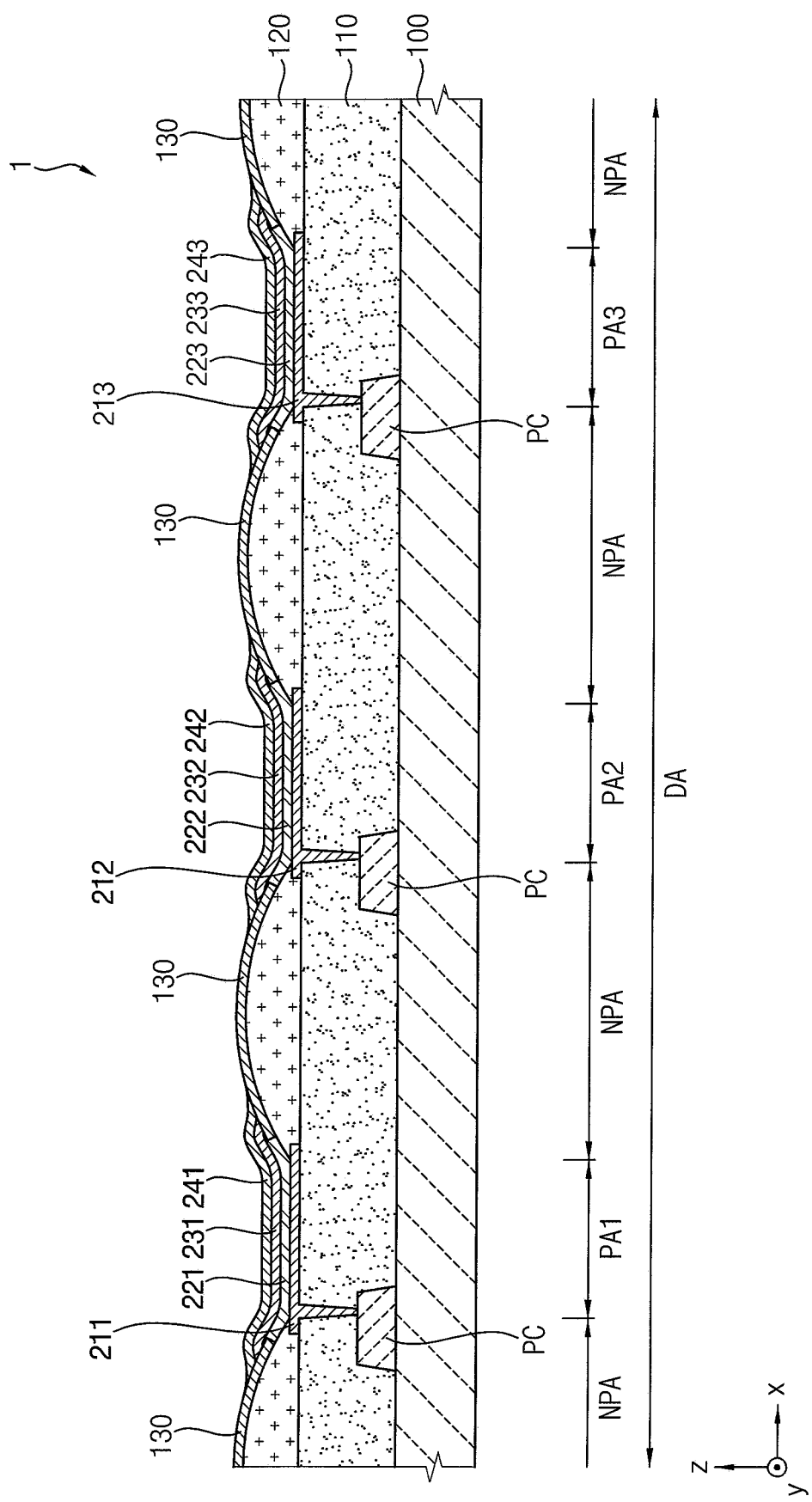

Referring to FIG. 1I, the third masking layer 1030 may be removed through a lift-off process. In addition, the third light emitting layer 223, the third counter electrode 233, and the third passivation layer 243, which are configured to have an island shape, may remain at (e.g., in or on) the third pixel area PA3. Because the lift-off process is the same or substantially the same as (or similar to) the lift-off process of the first masking layer 1010, redundant descriptions thereof may not be repeated.

Thereafter, the manufacturing method may further include forming a sealing substrate or a thin film encapsulation layer. Accordingly, the display apparatus may be manufactured.

In the present embodiment, step coverages of a chemical vapor deposition process for forming the first to third passivation layers, thicknesses of the first to third lower and upper lift-off layers, and a size and a shape of the under-cut profile may be variously modified, so that process conditions for sufficiently ensuring the opening area (e.g., see OA in FIG. 1E) may be set.

In this case, under general process conditions, when the sum of a thickness of the first lower lift-off pattern 1110 and a thickness of the first upper lift-off pattern 1115 is 1.2 um (micrometer) or less, the opening area OA may be sufficiently formed. When the sum of the thickness of the first lower lift-off pattern 1110 and the thickness of the first upper lift-off pattern 1115 exceeds 1.2 um (micrometer), the first passivation layer 241 may be deposited on the side surfaces of the first lower and upper lift-off patterns 1110 and 1115, so that the lift-off process may not be easily performed.

Figure 2:
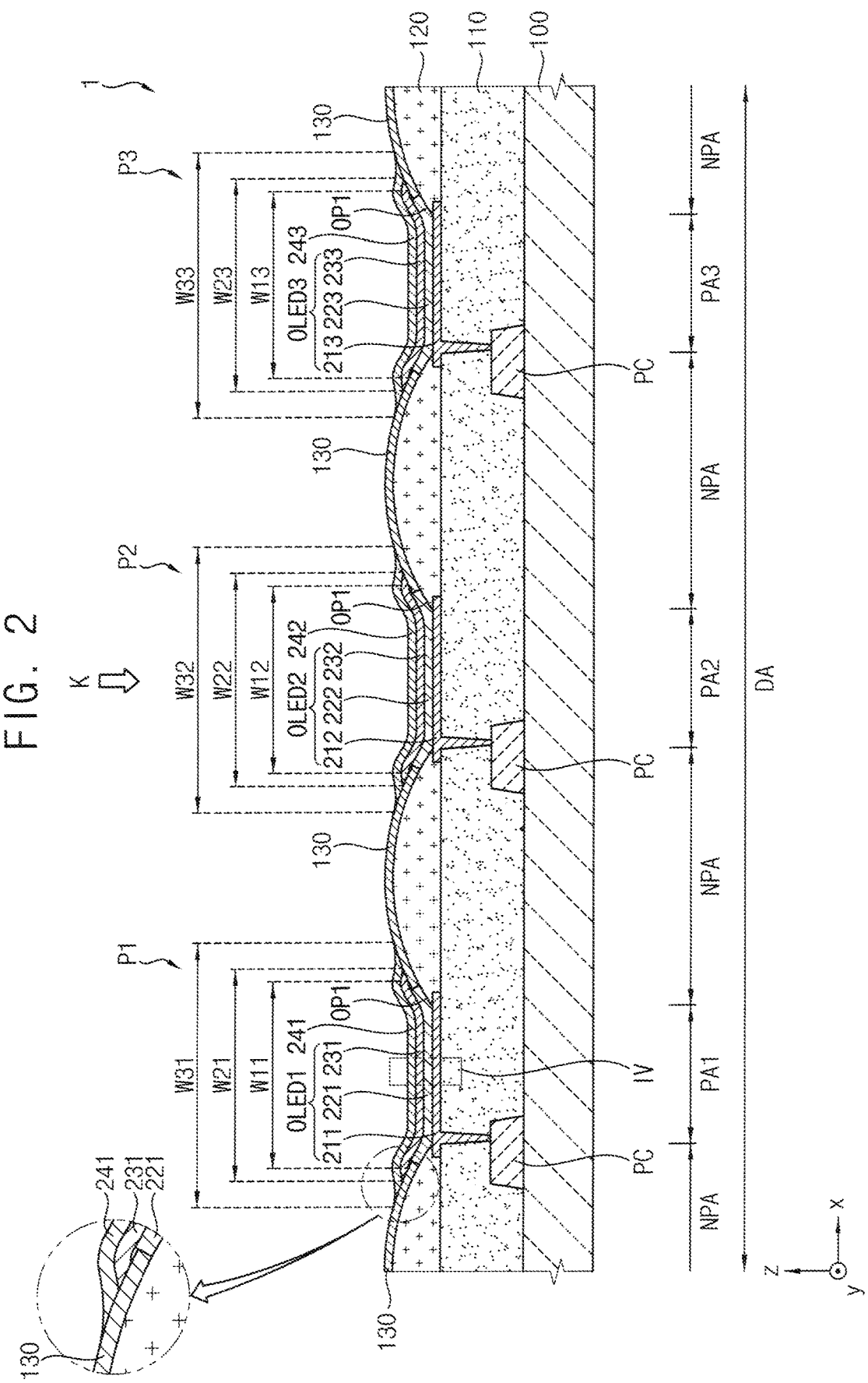
FIG. 2 is a cross-sectional view showing a display apparatus manufactured by the method of FIGS. 1A to 1I.

FIG. 2 is a cross-sectional view showing the display apparatus manufactured by the method of FIGS. 1A to 1I, and FIG. 3 is an enlarged sectional view of the portion IV in FIG. 2.

Referring to FIG. 2, a display area DA may include the first to third pixel areas PA1, PA2, and PA3 in which pixels, for example, first to third pixels P1, P2, and P3 are disposed, respectively, and may include the non-pixel area NPA disposed between adjacent pixel areas. As used in the present disclosure, the pixel area may correspond to an area from which light is actually emitted, or in other words, an emission area.

The first to third pixels P1, P2, and P3 may implement mutually different colors. For example, the first pixel P1 may implement a red color, the second pixel P2 may implement a green color, and the third pixel P3 may implement a blue color. In another embodiment, the display area DA may further include a fourth pixel configured to implement a white color.

The circuit element layer 110 including the pixel circuit PC may be provided on the substrate 100. The pixel circuit PC may include a thin film transistor and a storage capacitor. The pixel circuit PC may be disposed for each of the first to third pixels P1, P2, and P3.

The first to third pixels P1, P2, and P3 may include first to third organic light emitting diodes OLED1, OLED2, and OLED3 that are electrically connected to the pixel circuits PC, respectively. Each of the first to third organic light emitting didoes OLED1, OLED2, and OLED3 may include a pixel electrode, a light emitting layer, and a counter electrode.

The first organic light emitting diode OLED1 may include the first pixel electrode 211, the first light emitting layer 221, and the first counter electrode 231. The second organic light emitting diode OLED2 may include the second pixel electrode 212, the second light emitting layer 222, and the second counter electrode 232. The third organic light emitting diode OLED3 may include the third pixel electrode 213, the third light emitting layer 223, and the third counter electrode 233.

Ends of the first to third pixel electrodes 211, 212, and 213 may be covered with the pixel defining layer 120 so as to increase distances relative to the first to third counter electrodes 231, 232, and 233, respectively, such that a short circuit may be prevented. Top surfaces of the first to third pixel electrodes 211, 212, and 213 may be exposed through openings OP1 of the pixel defining layer 120, and the first to third pixel electrodes 211, 212, and 213 may overlap with the first to third light emitting layers 221, 222, and 223 through the openings OP1, respectively.

The first to third pixel electrodes 211, 212, and 213 may be configured to have an island shape arranged to correspond to the first to third pixel areas PA1, PA2, and PA3, respectively, and may be disposed on the circuit element layer 110 while being spaced apart from each other.

The first to third pixel electrodes 211, 212, and 213 may be reflective electrodes or transmissive electrodes.

The first to third light emitting layers 221, 222, and 223 may be configured to have an island shape arranged to correspond to the first to third pixel areas PA1, PA2, and PA3, respectively, and may be spaced apart from each other. The first to third light emitting layers 221, 222, and 223 may be disposed on the first to third pixel electrodes 211, 212, and 213, respectively, through the openings OP1 of the pixel defining layer 120.

Figure 3:
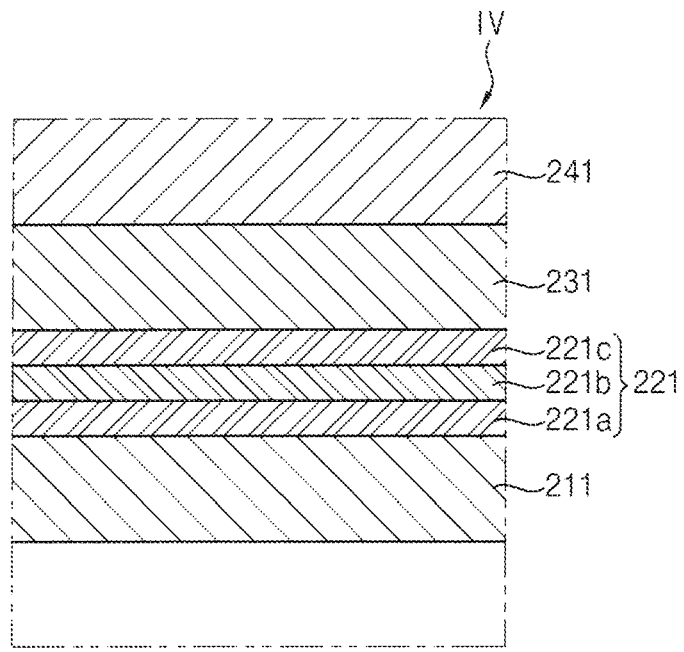
FIG. 3 is an enlarged sectional view of the portion IV in FIG. 2.

Referring to FIGS. 2 and 3, the first light emitting layer 221 may include an organic light emitting layer 221*b*. The organic light emitting layer 221*b* may be, for example, an organic light emitting layer configured to emit a red colored light. The first light emitting layer 221 may further include first and second functional layers 221*a* and 221*c* disposed on and/or under the organic light emitting layer 221*b*. For example, as shown in the embodiment of FIG. 3, the first functional layer 221*a* may be disposed under the organic light emitting layer 221*b*, and the second functional layer 221*c* may be disposed above the organic light emitting layer 221*b*. The first functional layer 221*a* may include a hole injection layer HIL and/or a hole transport layer HTL, and the second functional layer 221*c* may include an electron transport layer ETL and/or an electron injection layer EIL.

Referring again to FIG. 2, the second light emitting layer 222 may include an organic light emitting layer configured to emit a green light. The second light emitting layer 222 may further include functional layers disposed on and/or under the organic light emitting layer, for example, such as a hole injection layer, a hole transport layer, an electron transport layer, and/or an electron injection layer. The third light emitting layer 223 may include an organic light emitting layer configured to emit a blue light. The third light emitting layer 223 may further include functional layers disposed on and/or under the organic light emitting layer, for example, such as a hole injection layer, a hole transport layer, an electron transport layer, and/or an electron injection layer.

Thicknesses of the first to third light emitting layers 221, 222, and 223 may be different from each other. Because the first to third light emitting layers 221, 222, and 223 are independently/individually patterned through the process described above, materials, thicknesses, and/or the like of the functional layers of the first to third light emitting layers 221, 222, and 223 may be different from each other.

The first to third counter electrodes 231, 232, and 233 may be configured to have an island shape arranged to correspond to the first to third pixel areas PA1, PA2, and PA3, respectively, and may be spaced apart from each other. The first to third counter electrodes 231, 232, and 233 may be disposed on the first to third light emitting layers 221, 222, and 223, respectively.

Widths w21, w22, and w23 of the first to third counter electrodes 231, 232, and 233 may be greater than widths w11, w12, and w13 of the first to third light emitting layers 221, 222, and 223, respectively. Ends of the first to third counter electrodes 231, 232, and 233 may extend farther toward the connection electrode 130 than ends of the first to third light emitting layers 221, 222, and 223, respectively, so as to make contact with the connection electrode 130.

The first to third counter electrodes 231, 232, and 233 may be transmissive electrodes or reflective electrodes.

The first to third counter electrodes 231, 232, and 233 may be covered with the first to third passivation layers 241, 242, and 243, respectively. The first to third passivation layers 241, 242, and 243 may prevent or substantially prevent the first to third counter electrodes 231, 232, and 233 and the layers under the first to third counter electrodes 231, 232, and 233 from being damaged during a manufacturing process, respectively. Widths w31, w32, and w33 of the first to third passivation layers 241, 242, and 243 may be greater than the widths w21, w22, and w23 of the first to third counter electrodes 231, 232, and 233. For example, ends of the first to third passivation layers 241, 242, and 243 may extend farther toward the connection electrode 130 than the ends of the first to third light emitting layers 221, 222, and 223, respectively, so as to make contact with the connection electrode 130.

The first to third counter electrodes 231, 232, and 233 configured to have an island shape while being spaced apart from each other may be electrically connected to each other through the connection electrode 130, and may be connected to a common power line to receive a common voltage ELVSS.

The connection electrode 130 may be disposed to correspond to the non-pixel area NPA. The connection electrode 130 may be disposed on the pixel defining layer 120, and may make direct contact with the pixel defining layer 120. The connection electrode 130 may include a conductive material, for example, such as a metal, a transparent conductive oxide (TCO), or the like, and may be configured as a single layer or multiple layers.

Referring to an enlarged portion shown in FIG. 2, the first counter electrode 231 may extend onto the connection electrode 130, and may make direct contact with the top surface of the connection electrode 130 while a part (e.g., an end) of the first counter electrode 231 overlaps with the connection electrode 130. Similarly, each of the second and third counter electrodes 232 and 233 may extend onto the connection electrode 130, and may make direct contact with the top surface of the connection electrode 130 while a part (e.g., an end) of each of the second and third counter electrodes 232 and 233 overlaps with the connection electrode 130. As described above, the connection electrode 130 may make direct contact with the first to third counter electrodes 231, 232, and 233.

Figure 4:
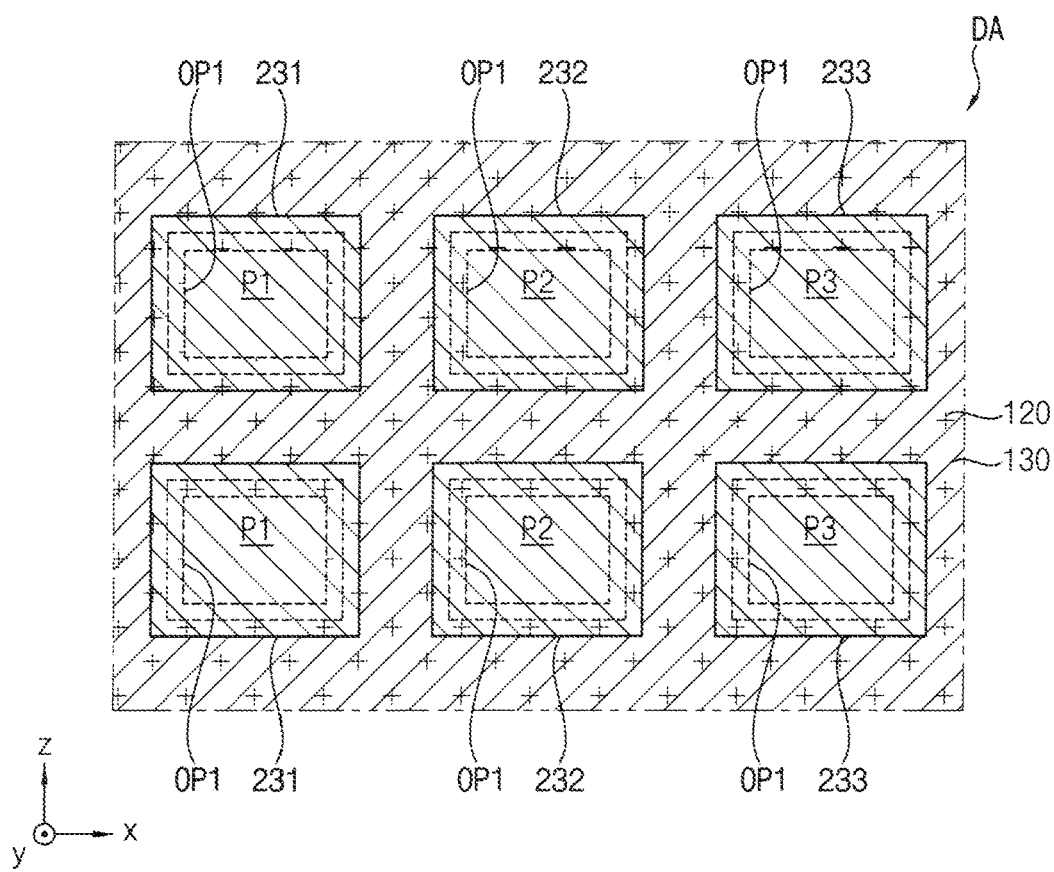
FIG. 4 is a plan view showing the display apparatus of FIG. 2 viewed in a direction K.

FIG. 4 is a plan view showing the display apparatus of FIG. 2 viewed in a direction K. For convenience of illustration, FIG. 4 shows the pixel defining layer 120, the connection electrode 130, and the first to third counter electrodes 231, 232, and 233 of the display apparatus of FIG. 2.

Referring to FIG. 4, in some embodiments, the connection electrode 130 may be disposed at (e.g., in or on) the non-pixel area NPA to have a mesh shape. The connection electrode 130 may be disposed on the pixel defining layer 120 at (e.g., in or on) the non-pixel area NPA, and may make direct contact with the first to third counter electrodes 231, 232, and 233 disposed at (e.g., in or on) the first to third pixel areas PA1, PA2, and PA3, respectively, while partially overlapping with the first to third counter electrodes 231, 232, and 233.

However, the present disclosure is not limited thereto, and the connection electrode 130 may be patterned in various suitable shapes, for example, such as a stripe shape, instead of the mesh shape shown in FIG. 4, as long as the connection electrode 130 is disposed on the pixel defining layer 120 at (e.g., in or on) the non-pixel area NPA, and makes direct contact with the first to third counter electrodes 231, 232, and 233 while partially overlapping with the first to third counter electrodes 231, 232, and 233.

FIGS. 5A to 5E are cross-sectional views illustrating a method of manufacturing a display apparatus according to embodiments. The manufacturing method of FIGS. 5A to 5E is the same or substantially the same as the manufacturing method of FIGS. 1A to 1E, except for a position of the first masking layer on which the under-cut profile is formed may be different. Therefore, redundant descriptions thereof may not be repeated.

Referring to FIGS. 5A and 5B, a circuit element layer 110 including a pixel circuit PC, and first to third pixel electrodes 211, 212, and 213 corresponding to first to third pixel areas PA1, PA2, and PA3, respectively, may be formed on a substrate 100. A pixel defining layer 120 having openings OP1 that expose the first to third pixel electrodes 211, 212, and 213, respectively, may be formed. A connection electrode 130 may be formed on the pixel defining layer 120 at (e.g., in or on) a non-pixel area NPA.

Referring to FIG. 5C, a first masking layer 1010 having an opening corresponding to the first pixel area PA1 may be formed. The first masking layer 1010 may include: a first photoresist pattern 1210; a first lower lift-off pattern 1110; and a first upper lift-off pattern 1115. The first lower lift-off pattern 1110 and the first upper lift-off pattern 1115 may be disposed between the first photoresist pattern 1210 and the pixel defining layer 120.

Figure 5E:
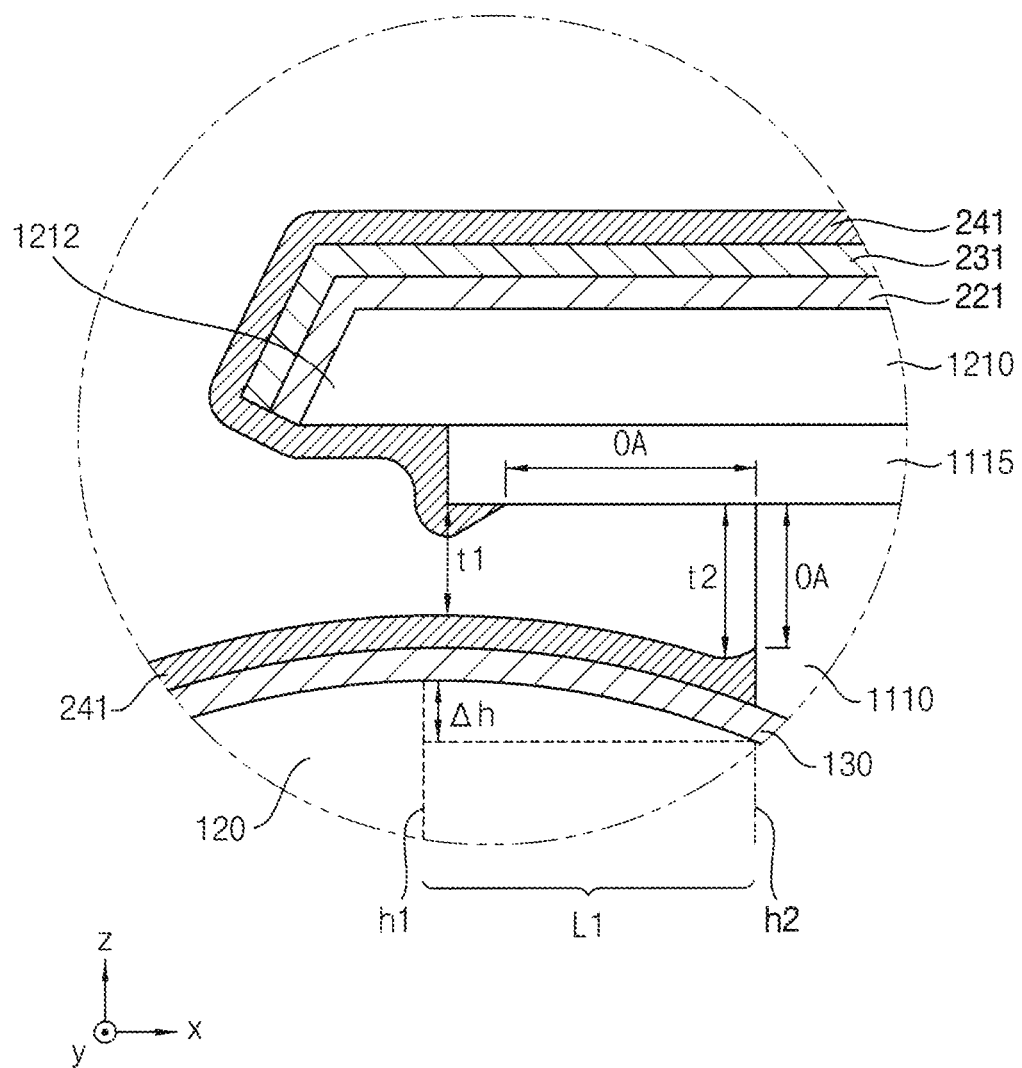

Referring to FIGS. 5D and 5E, a first light emitting layer 221, a first counter electrode 231, and a first passivation layer 241 may be sequentially formed on the substrate 100 on which the first masking layer 1010 is formed. In this case, FIG. 5E is a partially enlarged view showing an end of the first masking layer 1010 of FIG. 5D, in which a shape of the first passivation layer 241 is shown in more detail.

The first light emitting layer 221 and the first counter electrode 231 may be formed by a thermal evaporation scheme (e.g., a thermal evaporation process).

The first passivation layer 241 may include an inorganic insulating material, for example, such as silicon oxide ($SiO_x$), silicon nitride ($SiN_x$), and/or silicon oxynitride (SiON), and may be configured as a single layer or multiple layers.

In an embodiment, the first passivation layer 241 may be formed by a chemical vapor deposition (CVD) scheme (e.g., a CVD process).

In this case, an end, or in other words, a side surface of the first lower lift-off pattern 1110 of the first masking layer 1010 may be spaced apart by a distance L1 from a highest portion of the pixel defining layer 120 that has a first height h1, so as to be formed at (e.g., on) a portion of the pixel defining layer 120 that has a second height h2 that is lower than the first height h1 by a difference Δh. Therefore, at an end of the first upper lift-off pattern 1115, a first separation distance t1 between the first upper lift-off pattern 1115 and a configuration (e.g., the first passivation layer 241) disposed on the substrate 100 may be smaller than a second separation distance t2 between a portion of the first upper lift-off pattern 1115 that is adjacent to the side surface of the first lower lift-off pattern 1110 and the configuration disposed on the substrate 100.

Further, in this case, as discussed above, the first lower lift-off pattern 1110 may have a sufficient thickness, such that the first masking layer 1010 may have a flat or substantially flat top surface, while maintaining a suitable spacing between the end of the first upper lift-off pattern 1115 and the pixel defining layer 120.

Accordingly, when the first passivation layer 241 is formed, it may be difficult to deposit a deposition material constituting the first passivation layer 241 on a bottom surface of the first upper lift-off pattern 1115 and the side surface of the first lower lift-off pattern 1110. Therefore, an opening area OA at (e.g., in or on) which the first passivation layer 241 is not formed may be sufficiently ensured as compared with the case of FIG. 1E.

Thereafter, the display apparatus may be manufactured by repeating the above processes described with reference to FIGS. 5C and 5D for each of the second pixel area PA2 and the third pixel area PA3 through processes that are the same or substantially the same as (or similar to) the processes of the method of manufacturing the display apparatus described with reference to FIGS. 1A to 1I. Therefore, redundant descriptions thereof may not be repeated.

Figure 6A:
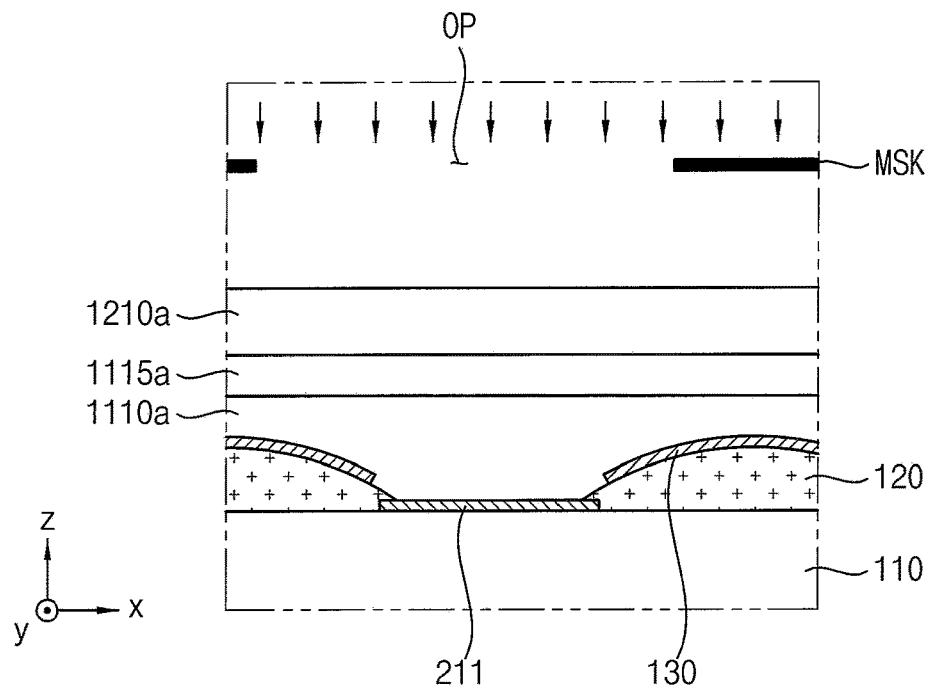
FIGS. 6A-6C are sectional views illustrating the forming of a first masking layer in more detail of a method of manufacturing a display apparatus according to embodiments.
Figure 6B:
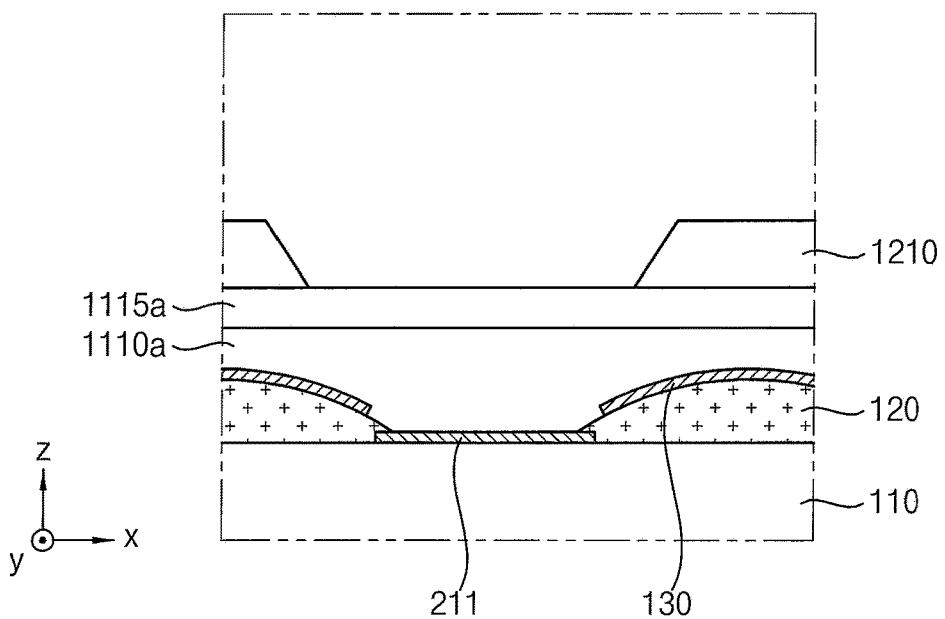
Figure 6C:
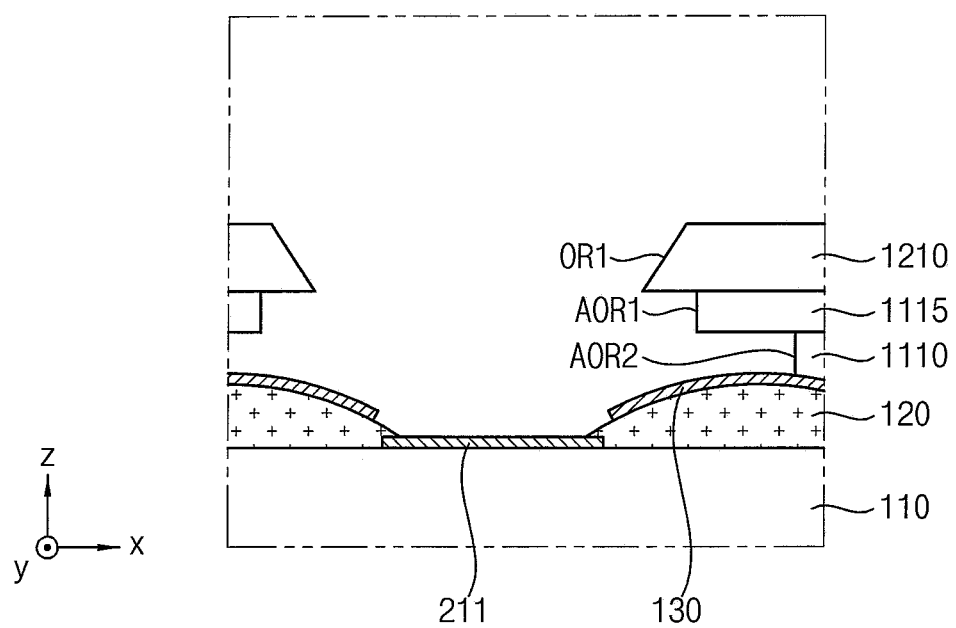

FIGS. 6A to 6C are sectional views illustrating the forming of a first masking layer in more detail of a method of manufacturing a display apparatus according to embodiments.

Referring to FIG. 6A, a first lower lift-off layer 1110a may be formed on a substrate on which a circuit element layer 110 including a pixel circuit, a first pixel electrode 211, a pixel defining layer 120, and a connection electrode 130 are formed. A first upper lift-off layer 1115a may be formed on the first lower lift-off layer 1110a. A first photoresist layer 1210a may be formed on the first upper lift-off layer 1115a.

Thereafter, the first photoresist layer 1210a may be exposed by using a mask MSK. The mask MSK may have an opening OP configured to transmit light correspondingly to an area at (e.g., in or on) which a first light emitting layer and a first counter electrode are to be formed.

Referring to FIG. 6B, a first photoresist pattern 1210 may be formed by developing the first photoresist layer 1210a. In the first photoresist pattern 1210 that is patterned by the exposure and the development of the first photoresist layer 1210a, portions corresponding to the area at (e.g., in or on) which the first light emitting layer and the first counter electrode are to be formed may be removed, and the rest of the first photoresist layer 1210a may remain.

Referring to FIG. 6C, a first upper lift-off pattern 1115 and a first lower lift-off pattern 1110 may be formed by etching the first upper lift-off layer 1115a and the first lower lift-off layer 1110a, respectively, by using the first photoresist pattern 1210 as an etch barrier. In this case, wet etching may be used, and constituent materials of the first lower lift-off layer 1110a and the first upper lift-off layer 1115a may be composed such that an etch selectivity of the first lower lift-off layer 1110a is higher than an etch selectivity of the first upper lift-off layer 1115a. Accordingly, the first lower lift-off layer 1110a and the first upper lift-off layer 1115a may be etched by using the same etching solution, and due to a difference in the etch selectivities thereof, the first lower lift-off pattern 1110 having a second auxiliary opening region AOR2 that is larger than a first auxiliary opening region AOR1 of the first upper lift-off pattern 1115 may be easily formed by a single etching process.

Figure 7A:
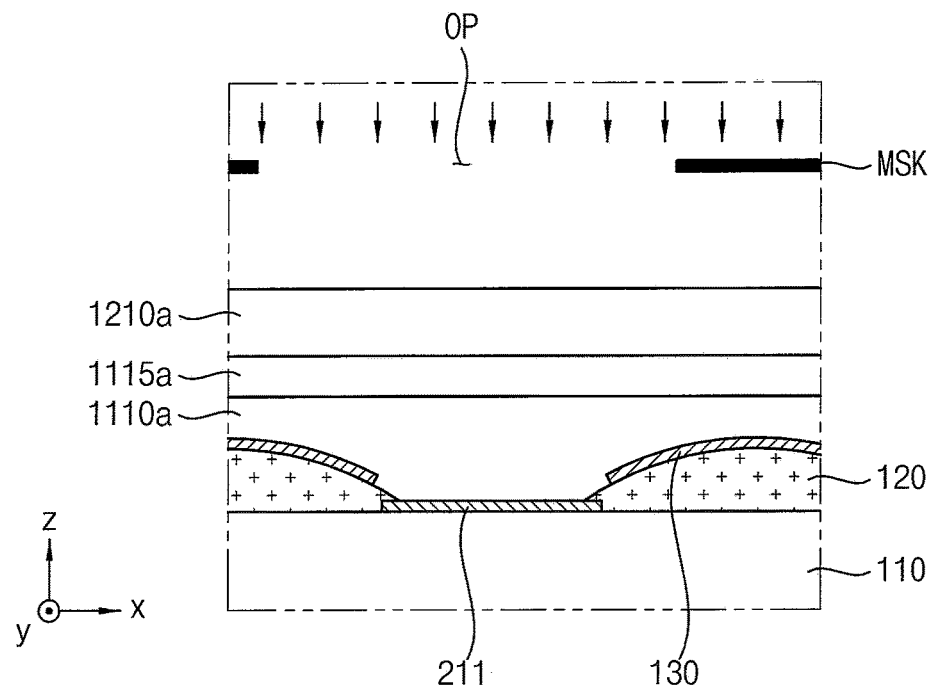
FIGS. 7A-7B are sectional views illustrating the forming of a first masking layer in more detail of a method of manufacturing a display apparatus according to embodiments.
Figure 7B:
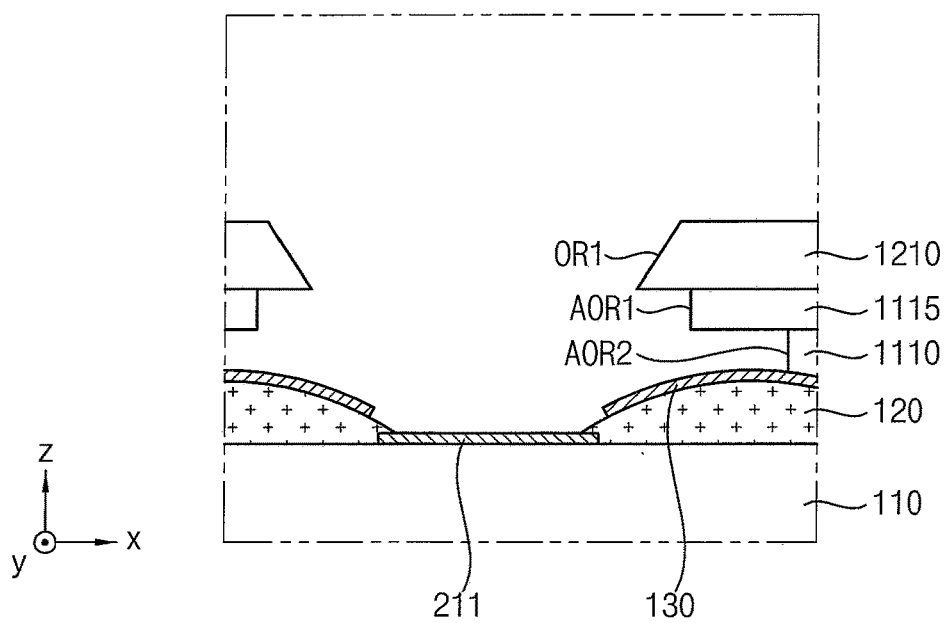

FIGS. 7A and 7B are sectional views illustrating the forming of a first masking layer in more detail of a method of manufacturing a display apparatus according to embodiments. The forming of the first masking layer in the manufacturing method of FIGS. 7A and 7B is the same or substantially the same as the forming of the first masking layer of the method of FIGS. 6A to 6C, except that the first photoresist layer 1210a, the first upper lift-off layer 1115a, and the first lower lift-off layer 1110a are patterned by a single process. Therefore, redundant descriptions thereof may not be repeated.

Referring to FIG. 7A, a first lower lift-off layer 1110a, a first upper lift-off layer 1115a, and a first photoresist layer 1210a may be sequentially formed on a substrate on which a circuit element layer 110 including a pixel circuit, a first pixel electrode 211, a pixel defining layer 120, and a connection electrode 130 are formed.

Thereafter, the first photoresist layer 1210a may be exposed by using a mask MSK. The mask MSK may have an opening OP configured to transmit light correspondingly to an area at (e.g., in or on) which a first light emitting layer and a first counter electrode are to be formed.

Referring to FIG. 7B, a first photoresist pattern 1210, a first upper lift-off pattern 1115, and a first lower lift-off pattern 1110 may be formed by concurrently (e.g., simultaneously) performing development of the first photoresist layer 1210a and etching of the first upper and first lower lift-off layers 1115a and 1110a. A developing and etching solution may be used in this case to develop the first photoresist layer 1210a that is exposed while etching the first upper and first lower lift-off layers 1115a and 1110a. In this case, constituent materials of the first lower lift-off layer 1110a and the first upper lift-off layer 1115a may be composed such that an etch selectivity of the first lower lift-off layer 1110a is higher than an etch selectivity of the first upper lift-off layer 1115a.

FIGS. 8A to 8D are sectional views illustrating the forming of a first masking layer in more detail of a method of manufacturing a display apparatus according to embodiments. The forming of the first masking layer in the manufacturing method of FIGS. 8A to 8D is the same or substantially the same as the forming of the first masking layer of the method of FIGS. 6A to 6C, except that the first upper lift-off layer 1115a and the first lower lift-off layer 1110a are patterned by separate processes. Therefore, redundant descriptions thereof may not be repeated.

Figure 8A:
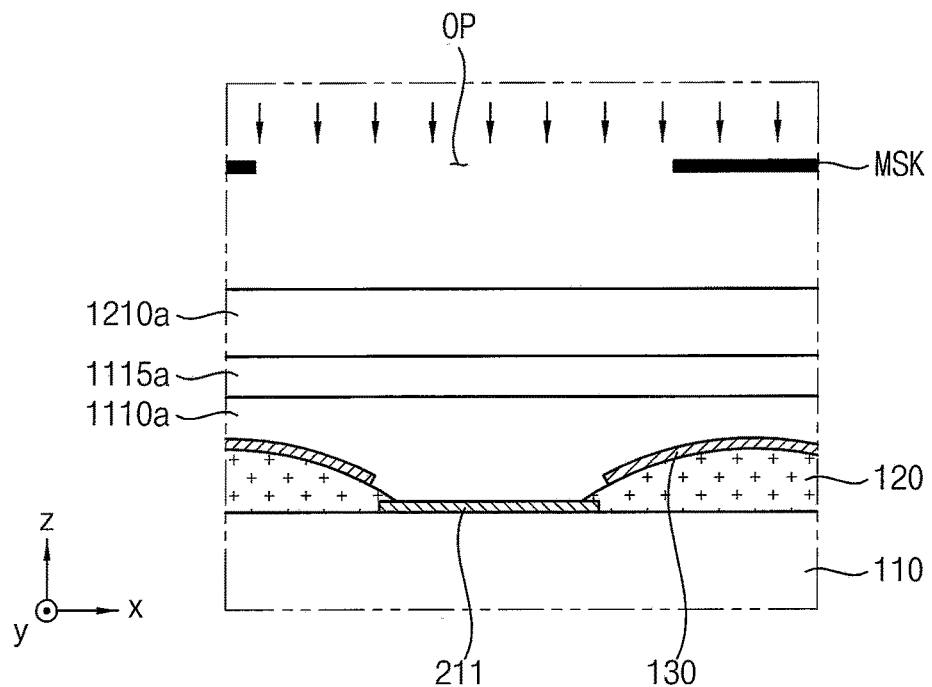
FIGS. 8A-8D are sectional views illustrating the forming of a first masking layer in more detail of a method of manufacturing a display apparatus according to embodiments.

Referring to FIG. 8A, a first lower lift-off layer 1110a, a first upper lift-off layer 1115a, and a first photoresist layer 1210a may be sequentially formed on a substrate on which a circuit element layer 110 including a pixel circuit, a first pixel electrode 211, a pixel defining layer 120, and a connection electrode 130 are formed. In this case, the first lower lift-off layer 1110a and the first upper lift-off layer 1115a may include mutually different materials that may be etched by mutually different etching solutions.

Thereafter, the first photoresist layer 1210a may be exposed by using a mask MSK. The mask MSK may have an opening OP configured to transmit light correspondingly to an area at (e.g., in or on) which a first light emitting layer and a first counter electrode are to be formed.

Figure 8B:
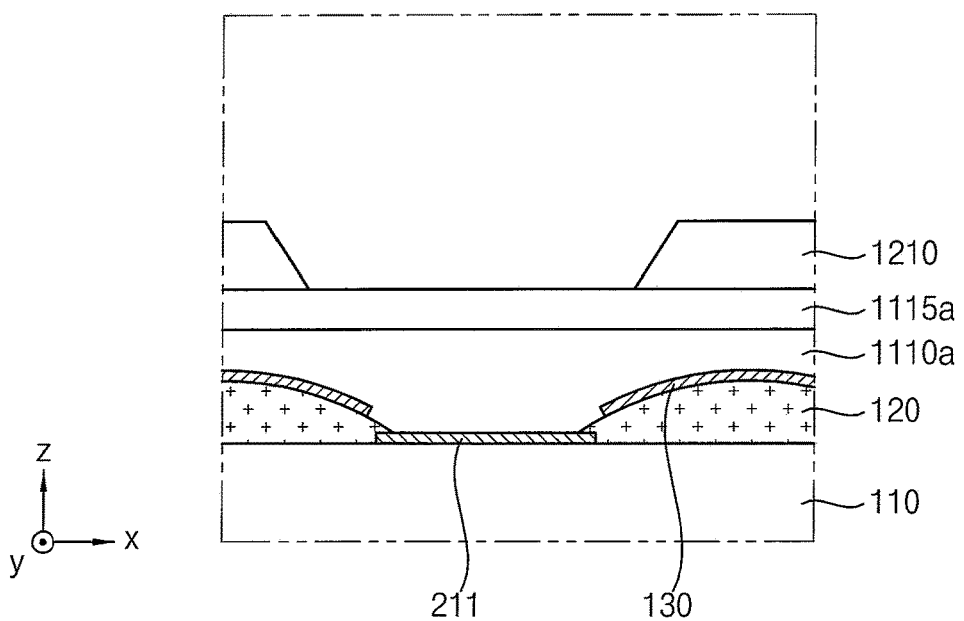

Referring to FIG. 8B, a first photoresist pattern 1210 may be formed by developing the first photoresist layer 1210a.

Figure 8C:
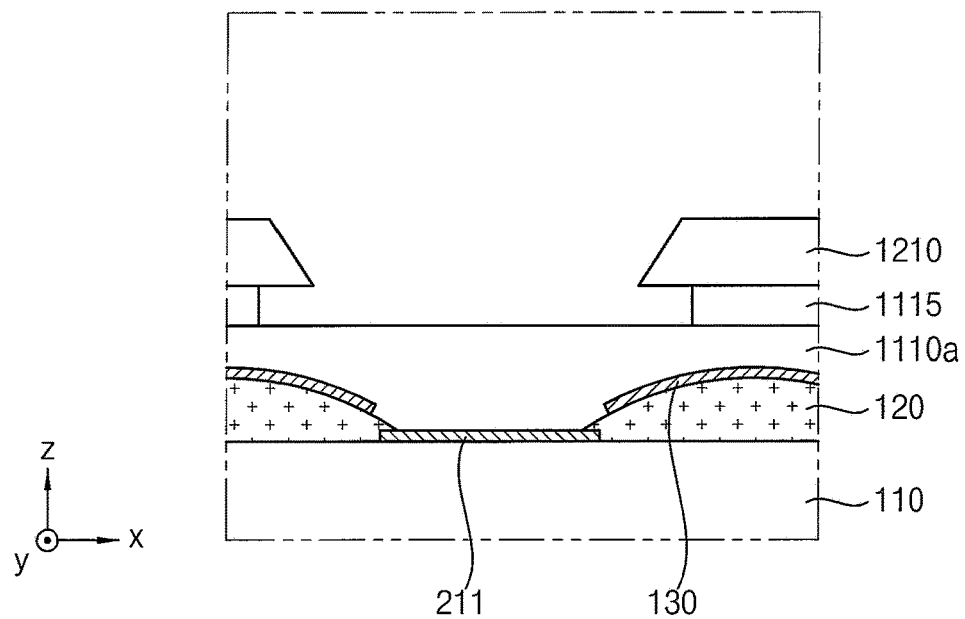

Referring to FIG. 8C, the first upper lift-off pattern 1115 may be formed by etching the first upper lift-off layer 1115a by using the first photoresist pattern 1210 as an etch barrier. In this case, wet etching may be used, and an etching solution that etches the first upper lift-off layer 1115a without etching the first lower lift-off layer 1110a may be used.

Figure 8D:
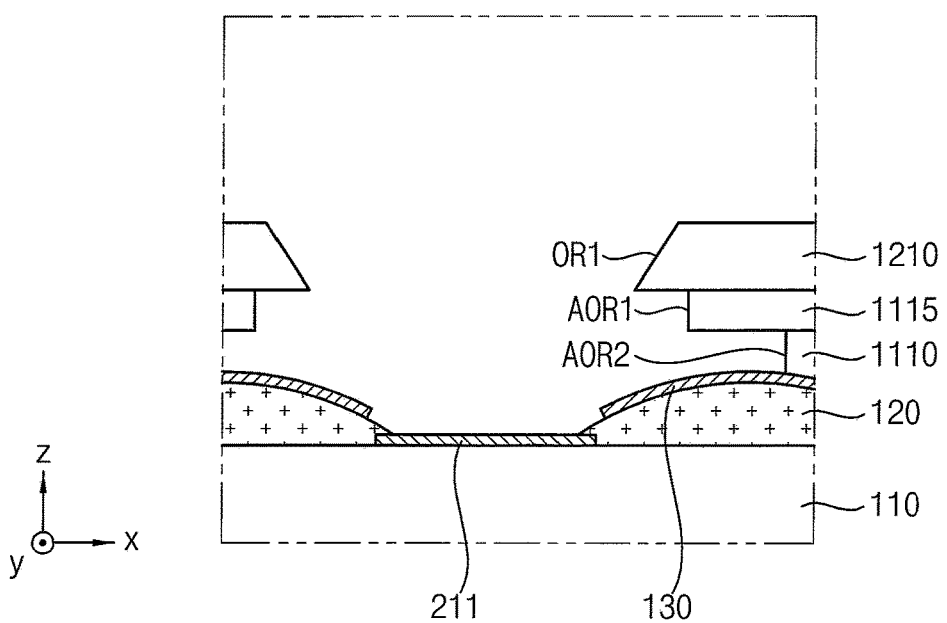

Referring to FIG. 8D, the first lower lift-off pattern 1110 may be formed by etching the first lower lift-off layer 1110a by using the first photoresist pattern 1210 and the first upper lift-off pattern 1115 as etch barriers. In this case, the wet etching may be used, and an etching solution that etches the first lower lift-off layer 1110a without etching the first upper lift-off pattern 1115 may be used.

According to embodiments of the present disclosure, the method of manufacturing the display apparatus may include: forming a first lower lift-off layer, a first upper lift-off layer, and a first photoresist layer on a substrate on which a first pixel electrode is formed; forming a first masking layer including a first photoresist pattern, a first upper lift-off pattern, and a first lower lift-off pattern, which expose the first pixel electrode, by partially removing the first photoresist layer, the first upper lift-off layer, and the first lower lift-off layer; forming a first light emitting layer and a first counter electrode on the first pixel electrode by using the first masking layer; forming a first passivation layer on the first counter electrode; and removing the first masking layer. An under-cut profile may be formed on the first masking layer, and the lift-off process of removing the first masking layer may be performed by dissolving the first lower and first upper lift-off patterns of the first masking layer by a stripper. In this case, because the stripper may dissolve the first upper and first lower lift-off patterns through an opening area that is an area at (e.g., in or on) which the first passivation layer is not formed on a surface of the first masking layer, the lift-off process may be easily performed.

ABILITY OF INDUSTRIAL UTILITY

Example embodiments of the present disclosure may be applied to a method of manufacturing a display apparatus and an electronic device including the display apparatus. For example, embodiments of the present disclosure may be applied to a smart phone, a cellular phone, a video phone, a smart pad, a smart watch, a tablet PC, a car navigation system, a television, a computer monitor, a laptop, a head mounted display (HMD) apparatus, and the like.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

DESCRIPTION OF THE REFERENCE NUMERALS

100: substrate
110: circuit element layer
120: pixel defining layer
130: connection electrode
211: first pixel electrode
221: first light emitting layer
231: first counter electrode
241: first passivation layer
1010: first masking layer
1110: first lower lift-off pattern
1115: first upper lift-off pattern
1210: first photoresist pattern

The invention claimed is:

1. A method of manufacturing a display apparatus, the method comprising:
    forming a first lower lift-off layer, a first upper lift-off layer, and a first photoresist layer on a substrate on which a first pixel electrode is formed;
    forming a first masking layer comprising a first photoresist pattern, a first upper lift-off pattern, and a first lower lift-off pattern, which expose the first pixel electrode, by partially removing the first photoresist layer, the first upper lift-off layer, and the first lower lift-off layer;
    forming a first light emitting layer and a first counter electrode on the first pixel electrode by using the first masking layer;
    forming a first passivation layer on the first counter electrode; and
    removing the first masking layer.

2. The method of claim 1, wherein the forming of the first masking layer comprises forming a double under-cut profile in the first masking layer, the double under-cut profile comprising:
    a first under-cut profile formed at ends of the first photoresist pattern and the first upper lift-off pattern; and
    a second under-cut profile formed between the first upper lift-off pattern and the first lower lift-off pattern.

3. The method of claim 2, wherein the first passivation layer is formed on the first counter electrode and the first masking layer, and the first passivation layer has an opening area that partially exposes a bottom surface of the first upper lift-off pattern.

4. The method of claim 1, further comprising:
    disposing a circuit element layer between the first pixel electrode and the substrate, the circuit element layer comprising a pixel circuit;
    disposing a pixel defining layer on the circuit element layer, the pixel defining layer having an opening that exposes the first pixel electrode; and
    disposing a connection electrode on the pixel defining layer.

5. The method of claim 4, wherein a first separation distance between the connection electrode and the first upper lift-off pattern at an end of the first upper lift-off pattern is smaller than a second separation distance between the connection electrode and a portion of the first upper lift-off pattern adjacent to a side surface of the first lower lift-off pattern.

6. The method of claim 4, wherein an end of each of the first light emitting layer and the first counter electrode has a forward tapered shape, and
    wherein the end of the first counter electrode extends farther toward the connection electrode than the end of the first light emitting layer to contact the connection electrode.

7. The method of claim 1, wherein the removing of the first masking layer comprises:
    removing the first upper and first lower lift-off patterns by using a stripper such that the first light emitting layer, the first counter electrode, and the first passivation layer, which have an island shape, remain on the first pixel electrode to form a first organic light emitting diode comprising the first pixel electrode, the first light emitting layer, and the first counter electrode.

8. The method of claim 1, further comprising:
forming a second lower lift-off layer, a second upper lift-off layer, and a second photoresist layer on the substrate on which the first passivation layer and second pixel electrode are formed;
forming a second masking layer comprising a second photoresist pattern, a second upper lift-off pattern, and a second lower lift-off pattern, which expose the second pixel electrode, by partially removing the second photoresist layer, the second upper lift-off layer, and the second lower lift-off layer;
forming a second light emitting layer and a second counter electrode on the second pixel electrode by using the second masking layer;
forming a second passivation layer on the second counter electrode; and
removing the second masking layer,
wherein the first light emitting layer comprises an organic light emitting layer configured to emit a first color light, and the second light emitting layer comprises an organic light emitting layer configured to emit a second color light that is different from the first color light.

9. The method of claim 8, further comprising:
disposing a circuit element layer between the first pixel electrode and the substrate, the circuit element layer comprising a pixel circuit;
disposing a pixel defining layer on the circuit element layer, the pixel defining layer having an opening that exposes the first pixel electrode; and
disposing a connection electrode on the pixel defining layer,
wherein the first counter electrode and the second counter electrode are electrically connected to the connection electrode.

10. The method of claim 1, wherein the forming of the first masking layer comprises:
forming the first photoresist pattern by exposing and developing the first photoresist layer; and
forming the first upper lift-off pattern and the first lower lift-off pattern by etching the first upper lift-off layer and the first lower lift-off layer by using a same etching solution while using the first photoresist pattern as an etch barrier, and
wherein an etch selectivity of the first lower lift-off layer is higher than an etch selectivity of the first upper lift-off layer with respect to the etching solution.

11. The method of claim 1, wherein the forming of the first masking layer comprises:
forming the first photoresist pattern by exposing and developing the first photoresist layer;
forming the first upper lift-off pattern by etching the first upper lift-off layer by using the first photoresist pattern as an etch barrier; and
forming the first lower lift-off pattern by etching the first lower lift-off layer by using the first photoresist pattern and the first upper lift-off pattern as etch barriers.

12. The method of claim 1, wherein the forming of the first masking layer comprises:
exposing the first photoresist layer; and
concurrently forming the first photoresist pattern, the first upper lift-off pattern, and the first lower lift-off pattern by developing the first photoresist layer while etching the first upper lift-off layer and the first lower lift-off layer by using a developing and etching solution.

13. The method of claim 1, wherein the first light emitting layer and the first counter electrode are formed through an evaporation process,
wherein the first passivation layer is formed through a chemical vapor deposition process, and
wherein a step coverage of the chemical vapor deposition process for forming the first passivation layer is greater than a step coverage of the evaporation process for forming the first light emitting layer and the first counter electrode.

14. The method of claim 13, wherein the first passivation layer comprises an inorganic insulating material.

15. The method of claim 14, wherein a sum of a thickness of the first lower lift-off pattern and a thickness of the first upper lift-off pattern is less than or equal to 1.2 um (micrometer).

16. A method of manufacturing a display apparatus, the method comprising:
forming a first masking layer comprising a first lower lift-off pattern and a first upper lift-off pattern on a substrate;
forming a first light emitting layer and a first passivation layer by using the first masking layer;
removing the first masking layer through a lift-off process;
forming a second masking layer comprising a second lower lift-off pattern and a second upper lift-off pattern on the substrate on which the first light emitting layer and the first passivation layer are formed;
forming a second light emitting layer and a second passivation layer by using the second masking layer; and
removing the second masking layer through the lift-off process.

17. The method of claim 16, wherein an under-cut profile is formed between the first upper lift-off pattern and the first lower lift-off pattern.

18. The method of claim 17, wherein the first masking layer further comprises a first photoresist pattern on the first upper lift-off pattern, and
wherein an under-cut profile is formed at ends of the first photoresist pattern and the first upper lift-off pattern, so that a double under-cut profile is formed in the first masking layer.

19. The method of claim 18, wherein the forming of the first masking layer comprises:
forming a first lower lift-off layer, a first upper lift-off layer, and a first photoresist layer;
forming the first photoresist pattern by exposing and developing the first photoresist layer;
forming the first upper lift-off pattern by etching the first upper lift-off layer by using the first photoresist pattern as an etch barrier; and
forming the first lower lift-off pattern by etching the first lower lift-off layer by using the first photoresist pattern and the first upper lift-off pattern as etch barriers.

20. The method of claim 17, wherein an etch selectivity of the first lower lift-off pattern is higher than an etch selectivity of the first upper lift-off pattern with respect to a same etching solution.

* * * * *